(12) United States Patent
Myung et al.

(10) Patent No.: US 11,569,936 B2
(45) Date of Patent: Jan. 31, 2023

(54) METHOD AND APPARATUS FOR CHANNEL ENCODING/DECODING IN COMMUNICATION OR BROADCAST SYSTEM

(71) Applicant: Samsung Electronics Co., Ltd., Suwon-si (KR)

(72) Inventors: Seho Myung, Seoul (KR); Min Jang, Seongnam-si (KR); Kyungjoong Kim, Suwon-si (KR); Seokki Ahn, Suwon-si (KR); Hongsil Jeong, Suwon-si (KR); Jaeyoel Kim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/496,623

(22) Filed: Oct. 7, 2021

(65) Prior Publication Data

US 2022/0045785 A1 Feb. 10, 2022

Related U.S. Application Data

(63) Continuation of application No. 16/610,491, filed as application No. PCT/KR2018/005094 on May 2, 2018, now Pat. No. 11,146,355.

(30) Foreign Application Priority Data

May 2, 2017 (KR) .................. 10-2017-0056566

(51) Int. Cl.
*H04L 1/00* (2006.01)
*H03M 13/11* (2006.01)
(Continued)

(52) U.S. Cl.
CPC ......... *H04L 1/0057* (2013.01); *H03M 13/116* (2013.01); *H03M 13/1165* (2013.01);
(Continued)

(58) Field of Classification Search
CPC ................. H04L 1/0057; H04L 1/0009; H04L 1/0041; H04L 1/0045; H04L 1/0061;
(Continued)

(56) References Cited

U.S. PATENT DOCUMENTS 6,769,093 B1 * 7/2004 Krieger .............. H04N 21/2383
370/335
7,430,256 B2 * 9/2008 Zhidkov .............. H04B 1/1027
375/346

(Continued)

FOREIGN PATENT DOCUMENTS

EP         3001571 A1    3/2016
KR    10-2016-0106474 A    9/2016

OTHER PUBLICATIONS

International Search Report dated Aug. 30, 2018 in connection with International Patent Application No. PCT/KR2018/005094, 2 pages.
(Continued)

*Primary Examiner* — John J Tabone, Jr.

(57) ABSTRACT

The present disclosure relates to a 5G or pre-5G communication system for supporting a higher data transfer rate beyond a 4G communication system, such as LTE. One embodiment of the present invention provides a method for channel encoding in a communication system, the method comprising: encoding second data, using an outer channel code; determining a value corresponding to first data, arranging the encoded second data in a block size unit corresponding to the second data, based on the determined value; and encoding the arranged second data, using an inner channel code.

20 Claims, 18 Drawing Sheets

(51) Int. Cl.
*H03M 13/00* (2006.01)
*H03M 13/27* (2006.01)
*H03M 13/29* (2006.01)
*H03M 13/37* (2006.01)
*H03M 13/09* (2006.01)
*H03M 13/15* (2006.01)

(52) U.S. Cl.
CPC ............... *H03M 13/2778* (2013.01); *H03M 13/2906* (2013.01); *H03M 13/3769* (2013.01); *H03M 13/616* (2013.01); *H03M 13/6306* (2013.01); *H04L 1/0009* (2013.01); *H04L 1/0041* (2013.01); *H04L 1/0045* (2013.01); *H04L 1/0061* (2013.01); *H04L 1/0065* (2013.01); *H03M 13/09* (2013.01); *H03M 13/152* (2013.01)

(58) Field of Classification Search
CPC ............ H04L 1/0065; H03M 13/116; H03M 13/1165; H03M 13/2778; H03M 13/2906; H03M 13/3769; H03M 13/616; H03M 13/6306; H03M 13/09; H03M 13/152
USPC ............... 714/752, 821, 782, 784, 786, 799
See application file for complete search history.

(56) References Cited

U.S. PATENT DOCUMENTS

| | | | | |
|---|---|---|---|---|
| 8,065,598 | B1* | 11/2011 | Gunnam | H03M 13/116 714/800 |
| 8,433,975 | B2* | 4/2013 | Hekstra | H04L 1/0054 714/760 |
| 8,621,318 | B1* | 12/2013 | Micheloni | G06F 11/1012 714/755 |
| 10,070,441 | B2* | 9/2018 | Park | H04N 21/4425 |
| 11,146,355 | B2* | 10/2021 | Myung | H03M 13/2906 |
| 2004/0260985 | A1* | 12/2004 | Krieger | H04J 3/0608 714/707 |
| 2006/0140299 | A1* | 6/2006 | Jin | H04L 27/3433 375/261 |
| 2008/0163026 | A1* | 7/2008 | Varnica | G06F 11/1008 714/755 |
| 2009/0097532 | A1 | 4/2009 | Molev-Shteiman et al. | |
| 2010/0251069 | A1* | 9/2010 | Sun | H04L 1/0045 714/763 |
| 2011/0235721 | A1* | 9/2011 | Chen | H04L 1/0072 375/E7.026 |
| 2011/0255631 | A1 | 10/2011 | Pi | |
| 2012/0198305 | A1* | 8/2012 | Abu-Surra | H03M 13/6525 714/E11.032 |
| 2012/0320994 | A1 | 12/2012 | Loghin et al. | |
| 2014/0177756 | A1* | 6/2014 | Park | H04L 27/10 375/320 |
| 2014/0317667 | A1* | 10/2014 | Jeong | H04N 21/2383 725/115 |
| 2016/0261281 | A1 | 9/2016 | Kim et al. | |
| 2017/0188367 | A1* | 6/2017 | Park | H04N 21/2402 |
| 2017/0343695 | A1* | 11/2017 | Stetson | G01V 3/101 |
| 2018/0102791 | A1* | 4/2018 | Zhang | H04L 1/0058 |
| 2020/0162195 | A1* | 5/2020 | Myung | H03M 13/116 |
| 2020/0366317 | A1* | 11/2020 | Myung | H03M 13/1111 |
| 2022/0045785 | A1* | 2/2022 | Myung | H04L 1/0041 |

OTHER PUBLICATIONS

Written Opinion of the International Searching Authority dated Aug. 30, 2018 in connection with International Patent Application No. PCT/KR2018/005094, 7 pages.
Guo-lei et al., "Design of Structured LDPC Codes with Quasi-Cyclic and Rotation Architecture", 2010, IEEE, pp. 655-657.
Kasami et al., "A Concatenated Coding Scheme for Error Control", May 1986, IEEE, pp. 481-488.
Kim et al., "Concatenated Codes Using Coded Modulation With a Phase Shift", 2012, IEEE, pp. 889-893.
Michael et al., Bit-Interleaved Coded Modulation (BICM) for ATSC 3.0, Mar. 2016, IEEE, vol. 62, No. 1, pp. 181-188.

* cited by examiner

FIG. 8

METHOD AND APPARATUS FOR CHANNEL ENCODING/DECODING IN COMMUNICATION OR BROADCAST SYSTEM

CROSS-REFERENCE TO RELATED APPLICATIONS

This application is a continuation of U.S. patent application Ser. No. 16/610,491 filed on Nov. 1, 2019, which is a 371 of International Application No. PCT/KR2018/005094 filed on May 2, 2018, which claims priority to Korean Patent Application No. 10-2017-0056566 filed on May 2, 2017, the disclosures of which are herein incorporated by reference in their entirety.

BACKGROUND

1. Field

The disclosure relates to a method and an apparatus for channel encoding/decoding in a communication or broadcast system.

2. Description of Related Art

To meet the demand for wireless data traffic having increased since deployment of 4G communication systems, efforts have been made to develop an improved 5G or pre-5G communication system. Therefore, the 5G or pre-5G communication system is also called a 'Beyond 4G Network' or a 'Post LTE System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed. [5] In addition, in the 5G communication system, hybrid FSK and QAM modulation (FQAM) and sliding window superposition coding (SWSC), as advanced coding modulation (ACM) systems, and filter bank multi carrier (FBMC), non-orthogonal multiple access (NOMA), and sparse code multiple access (SCMA), as advanced access technologies, have been developed.

In a communication or broadcast system, the link performance may be greatly deteriorated by various kinds of channel noises, fading phenomena, and inter-symbol interferences (IS). Accordingly, in order to implement a high-speed digital communication or broadcast system requiring high throughput and reliability, such as a next-generation mobile communication, digital broadcast, and portable Internet, it is required to develop a technology to overcome the noises, fading, and inter-symbol interferences. Recently, as a part of study to overcome the noises or the like, a study for an error-correcting code has actively been made as a method for heightening the reliability of the communication through efficient restoration of distorted information.

SUMMARY

Aspects of the disclosure provide a method and an apparatus for transmitting data using a quasi-cyclic shift and a cyclic shift in a codeword of a channel code.

Aspects of the disclosure provide a method and an apparatus for decoding data transmitted using a quasi-cyclic shift and a cyclic shift in a codeword of a channel code.

Aspects of the disclosure provide a method and an apparatus for decoding by combining received signals for data transmitted using a quasi-cyclic shift and a cyclic shift in a codeword of a channel code.

In an aspect of the disclosure in order to solve the above problems, a channel encoding method in a communication system includes encoding second data using an outer channel code; determining a value corresponding to first data; aligning the encoded second data in the unit of a block size corresponding to the second data based on the determined value; and encoding the aligned second data using an inner channel code.

In another aspect of the disclosure in order to solve the above problems, a channel decoding method in a communication system includes receiving a received signal corresponding to an inner channel code; determining input values for decoding the inner channel code from the received signal; decoding second data aligned in the unit of a block size corresponding to the second data based on a value corresponding to first data from the input values using the inner channel code; performing blind decoding of the decoded second data using an outer channel code; and identifying the value corresponding to the first data based on the result of the blind decoding.

In still another aspect of the disclosure in order to solve the above problems, a channel encoding apparatus in a communication system includes a transceiver; and a controller configured to: encode second data using an outer channel code, determine a value corresponding to first data, align the encoded second data in the unit of a block size corresponding to the second data based on the determined value, and encode the aligned second data using an inner channel code.

In still another aspect of the disclosure in order to solve the above problems, a channel decoding apparatus in a communication system includes a transceiver, and a contoller configured to: receive a received signal corresponding to an inner channel code, determine input values for decoding the inner channel code from the received signal, decode second data aligned in the unit of a block size corresponding to the second data based on a value corresponding to first data from the input values using the inner channel code, perform blind decoding of the decoded second data using an outer channel code, and identify the value corresponding to the first data based on the result of the blind decoding.

In still another aspect of the disclosure, a channel encoding method in a communication or broadcast system includes determining a quasi-cyclic shift value; generating a codeword by performing an outer channel encoding of data; performing an inner channel encoding of the codeword generated through the outer channel encoding; and performing a quasi-cyclic shift of the codeword generated through the inner channel encoding.

In still another aspect of the disclosure, a channel encoding method in a communication or broadcast system includes determining at least one of a quasi-cyclic shift value or a cyclic shift value; generating a codeword by performing an outer channel encoding of data; performing an inner channel encoding of the codeword generated through the outer channel encoding; performing a quasi-cyclic shift of the codeword generated through the inner channel encoding; and performing a cyclic shift of the quasi-cyclic-shifted codeword.

In still another aspect of the disclosure, a channel decoding method in a communication or broadcast system includes performing an inner channel decoding based on a received signal; performing a reverse quasi-cyclic shift of a codeword decoded through the inner channel decoding; performing an outer channel decoding of the reverse-quasi-cyclic-shifted codeword to determine whether an error is detected; iteratively performing the reverse quasi-cyclic shift and the outer channel decoding in accordance with whether the error is detected; and outputting a reverse quasi-cyclic shift value from which the error is not detected in the outer channel decoding.

In still another aspect of the disclosure, a channel decoding method in a communication or broadcast system includes performing a reverse cyclic shift of a received signal; performing an inner channel decoding based on the reverse-cyclic-shifted received signal; iteratively performing the reverse cyclic shift and the inner channel decoding in accordance with whether the inner channel decoding has succeeded; performing a reverse quasi-cyclic shift of a codeword decoded through the inner channel decoding; performing an outer channel decoding of the reverse-quasi-cyclic-shifted codeword to determine whether an error is detected; iteratively performing the reverse quasi-cyclic shift and the outer channel decoding in accordance with whether the error is detected; and outputting a cyclic shift value that has succeeded in the inner channel decoding and a reverse quasi-cyclic shift value from which the error is not detected in the outer channel decoding.

According to the disclosure, it is possible to transmit data through a codeword shift operation with respect to a channel code having the quasi-cyclic characteristics.

BRIEF DESCRIPTION OF THE DRAWINGS

FIG. 8 is another exemplary diagram of a quasi-cyclic shift of a codeword according to an embodiment of the disclosure;

DETAILED DESCRIPTION

Figure 1:
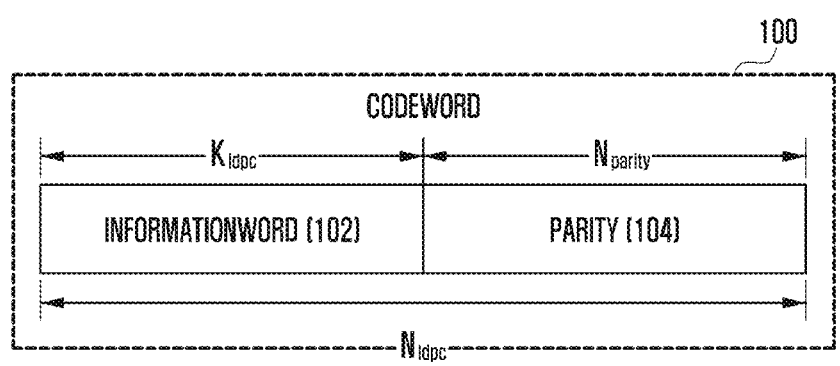
FIG. 1 is a diagram illustrating the structure of a systematic LDPC codeword.

Hereinafter, preferred embodiments of the disclosure will be described in detail with reference to the accompanying drawings. In describing the disclosure, detailed explanation of related well-known functions or configurations incorporated herein will be omitted in the case where it is determined that they obscure the subject matter of the disclosure in unnecessary detail. Further, terms to be described later am terms defined in consideration of their functions in the disclosure, but they may differ depending on intentions of a user and an operator or customs. Accordingly, they should be defined based on the contents of the whole description of the disclosure.

The primary subject matter of the disclosure can be applied to other systems having similar technical backgrounds through slight modifications within a range that does not greatly deviate from the scope of the disclosure, and this will be possible by the judgment of those of skilled in the art to which the disclosure pertains.

The aspects and features of the disclosure and methods for achieving the aspects and features will be apparent by referring to the embodiments to be described in detail with reference to the accompanying drawings. However, the disclosure is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the disclosure, and the disclosure is only defined within the scope of the appended claims. In the entire description of the disclosure, the same drawing reference numerals are used for the same elements across various figures.

A low density parity check (hereinafter, LDPC) code first introduced by Gallager in the 1960's had been forgotten for along time due to its complexity that was difficult to be implemented by the technical level at that time. However, as a turbo code proposed by Berrou, Glavieux, and Thitimajshima in 1993 showed the performance approaching the Shannon's channel capacity, many analyses of the performance and the characteristic of the turbo code were made, and many researches for channel encoding based on iterative decoding and a graph were made. Taking that opportunity, the LDPC code was re-studied in the latter half of the 1990's, and it has become clear that the LDPC code also have the performance approaching the Shannon's channel capacity in the case of performing decoding through application of the iterative decoding based on a sum-product algorithm on a Tanner graph corresponding to the LDPC code.

In general, the LDPC code may be defined as a parity check matrix, and it may be expressed using a bipartite graph that is commonly called a Tanner graph.

FIG. 1 is a diagram illustrating the structure of a systematic LDPC codeword.

Hereinafter, with reference to FIG. 1, a systematic LDCP codeword will be described.

The LDPC code receives an input of an information word 102 composed of $K_{ldpc}$ bits or symbols, and it generates a codeword 100 composed of $N_{ldpc}$ bits or symbols through LDPC encoding. Hereinafter, for convenience in explanation, it is assumed that an input of an information word 102 composed of $K_{ldpc}$ bits is received, and a codeword 100 composed of $N_{ldpc}$ bits is generated. That is, by performing LDPC encoding of the information word I=[$i_0$, $i_1$, $i_2$, ..., $i_{K_{ldpc}-1}$] 102 that is composed of $K_{ldpc}$ input bits, the codeword c=[$c_0$, $c_1$, $c_2$, ..., $C_{N_{ldpc}-1}$] 100 is generated. That is, the information word and the codeword are bit strings composed of a plurality of bits, and information word bits and codeword bits mean bits constituting the information word and the codeword. In general, the codeword is called a systematic code if the codeword includes an information word, such as C=[$c_0$, $c_1$, $c_2$, ..., $C_{N_{ldpc}-1}$]=[$i_0$, $i_1$, $i_2$, ..., $i_{K_{ldpc}-1}$, $P_0$, $P_1$, $P_2$, ..., $P_{N_{ldpc}-K_{ldpc}-1}$]. Here, P=[$p_0$, $p_1$, $p_2$, ..., $p_{N_{ldpc}-K_{ldpc}-1}$] is parity bits 104, and the number $N_{parity}$ of parity bits may be indicated as $N_{parity}=N_{ldpc}-K_{ldpc}$.

The LDPC code is a kind of linear block code, and it includes a process of determining a codeword satisfying a condition as expressed in mathematical expression 1 below.

Mathematical expression 1

$$H \cdot c^T = \begin{bmatrix} h_1 & h_2 & h_3 & \ldots & h_{N_{ldpc}-1} \end{bmatrix} \cdot c^T = \sum_{i=0}^{N_{ldpc}} c_i \cdot h_i = 0$$

Here, the codeword C is $$C = [C_0, C_1, C_2, \ldots, C_{N_{ldpc}-1}].$$

In the mathematical expression 1, H denotes a parity check matrix, C denotes a codeword, $c_i$ denotes the i-th bit of the codeword, and $N_{ldpc}$ denotes the length of the LDPC codeword. Here, $h_i$ denotes the i-th column of the parity check matrix H.

The parity check matrix H is composed of $N_{ldpc}$ columns the number of which is equal to the number of bits of the LDPC codeword. Because the mathematical expression 1 means that a sum of products of the i-th column $h_i$ of the parity check matrix and the i-th codeword bit $c_i$ becomes "0", it means that the i-th column $h_i$ is related to the i-th codeword bit $c_i$.

Figure 2:
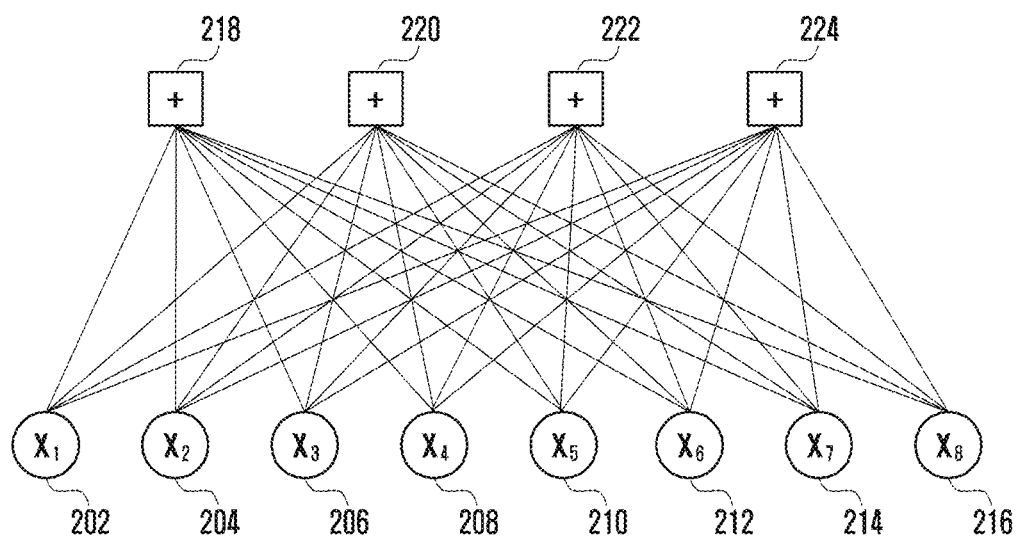
FIG. 2 is a diagram illustrating a graph expression method of an LDPC code.

With reference to FIG. 2, a graph expression method of the LDPC code will be described.

FIG. 2 is a diagram illustrating an example of a parity check matrix H1 of the LDPC code composed of 4 rows and 8 columns and the same illustrated as a Tanner graph. With reference to FIG. 2, the parity check matrix H1 has 8 columns, and thus a codeword having the length of 8 is generated. In this case, the code generated through H1 means the LDPC code, and each column corresponds to encoded 8 bits.

With reference to FIG. 2, the Tanner graph of the LDPC code that performs encoding and decoding based on the parity check matrix $H_1$ is composed of 8 variable nodes, that is, $x_1(202)$, $x_2(204)$, $x_3(206)$, $x_4(208)$, $x_5(210)$, $x_6(212)$, $x_7(214)$, and $x_8(216)$, and 4 check nodes 218, 220, 222, and 224. Here, the i-th column and the j-th row of the parity check matrix $H_1$ of the LDPC code correspond to the variable node $x_i$ and the j-th check node, respectively. Further, the value of "1", which is not "0", at a point where the j-th column and the j-th row of the parity check matrix $H_1$ of the LDPC code means that an edge connecting the variable node xi and the j-th check node to each other exists on the Tanner graph as shown in FIG. 2.

In the Tanner graph of the LDPC code, the degree of the variable nodes and the check nodes means the number of edges connected to the respective nodes, and it may be equal to the number of entries that are not "0" in the column or row corresponding to the corresponding node in the parity check matrix of the LDPC code. For example, the degrees of the variable nodes $x_1(202)$, $x_2(204)$, $x_3(206)$, $x_4(208)$, $x_5(210)$, $x_6(212)$, $x_7(214)$, and $x_8(216)$ in FIG. 2 become 4, 3, 3, 3, 2, 2, 2, and 2 in order, and the degrees of the check nodes 218, 220, 222, and 224 become 6, 5, 5, and 5 in order. Further, the number of entries that are not "0" in respective columns of the parity check matrix $H_1$ of FIG. 2 corresponding to the variable nodes of FIG. 2 coincides with the order of the above described degrees 4, 3, 3, 3, 2, 2, 2, and 2, and the number of entries that are not "0" in respective rows of the parity check matrix $H_1$ of FIG. 2 corresponding to the check nodes of FIG. 2 coincides with the order of the above-described degrees 6, 5, 5, and 5.

The LDPC code can be decoded using the iterative decoding algorithm based on the sum-product algorithm on the bipartite graph enumerated in FIG. 2. Here, the sum-product algorithm is a kind of message passing algorithm, and the message passing algorithm is an algorithm that exchanges messages through edges on the bipartite graph, and performs update by calculating an output message from the messages input to the variable nodes or check nodes.

Here, the value of the i-th encoding bit may be determined based on the message of the i-th variable node. The i-th encoding bit value can be obtained through both hard decision and soft decision. Accordingly, the performance of the i-th bit ci of the LDPC codeword may correspond to the performance of the i-th variable node of the Tanner graph, and it may be determined in accordance with the location and the number of "1" of the i-th column of the parity check matrix. In other words, the performance of the $N_{ldpc}$ codeword bits of the codeword may be carried away by the location and the number of "1" of the parity check matrix, and this means that the performance of the LDPC code is greatly influenced by the parity check matrix. Accordingly, in order to design the LDPC code having a superior performance, there is a need for a method for designing a good parity check matrix.

As the parity check matrix being used in the communication or broadcast system, for easy implementation, a quasi-cyde LDPC (QC-LDPC) code generally using a quasi-cyclic parity check matrix is widely used.

The QC-LDPC code is featured to have the panty check matrix composed of a zero matrix in the form of a small square matrix or a circulant permutation matrix. In this case, the permutation matrix means a matrix in which all entries of the square matrix are "0" or "1" and each row or column includes only one "1". Further, the circulant permutation matrix means a matrix in which respective entries of an identity matrix are circularly shifted to the right.

Hereinafter, the QC-LDPC code will be described in detail.

First, as in the mathematical expression 2, a circulant permutation matrix $P=(P_{i,j})$ having the size of L×L is defined. Here, $P_{i,j}$ means an entry in the i-th row and the j-th column of the matrix P (here, $0 \leq i,j < L$).

$$P_{i,j} = \begin{cases} 1 & \text{if } i+1 = j \bmod L \\ 0 & \text{otherwise} \end{cases} \quad \text{Mathematical expression 2}$$

Hereinafter, for convenience, only the circulant permutation matrix in the form in which the entries are circularly shifted in the rightward direction will be described, but in general, the present disclosure is also applicable to the circulant permutation matrix in the form in which the entries are circularly shifted in the leftward direction.

With respect to the permutation matrix P as defined above, $P^{i(0 \leq i < L)}$ is a circulant permutation matrix in the form in which the entries of the identity matrix having the size of L×L are circularly shifted in the rightward direction as many as i times.

The parity check matrix H of the simplest QC-LDPC code may be expressed in the form as in the following mathematical expression 3.

$$H = \begin{bmatrix} P^{a_{11}} & P^{a_{12}} & \cdots & P^{a_{1n}} \\ P^{a_{21}} & P^{a_{22}} & \cdots & P^{a_{2n}} \\ \vdots & \vdots & \ddots & \vdots \\ P^{a_{m1}} & P^{a_{m2}} & \cdots & P^{a_{mn}} \end{bmatrix} \quad \text{Mathematical expression 3}$$

If it is defined that $P_{-1}$ is a zero matrix (0-matrix) having the size of L×L, each exponential $a_{i,j}$ of the circulant permutation matrix or the zero matrix in the mathematical expression 3 may have one of values $\{-1, 0, 1, 2, \ldots, L-1\}$. Further, the parity check matrix H in the mathematical expression 3 is composed of n column blocks and m row blocks, and thus it has the size of mL×nL.

If the parity check matrix in the mathematical expression 3 has a full rank, it is apparent that the size of information word bits of the QC-LDPC code corresponding to the parity check matrix becomes (n-m)L For convenience, (n-m) column blocks corresponding to the information word bits are called information word column blocks, and m column blocks corresponding to the remaining parity bits are called parity column blocks.

In general, a binary matrix having a size of m×n obtained by respectively replacing each circulant permutation matrix and zero matrix in the parity check matrix of the mathematical expression 3 by "1" and "0" is called a mother matrix of the parity check matrix H or a base matrix M(H), and an integer matrix having a size of m×n obtained by selecting an exponent of each circulant permutation matrix or zero matrix is called an exponential matrix E(H) of the parity check matrix H as in a mathematical expression 4.

$$E(H) = \begin{bmatrix} a_{11} & a_{12} & \cdots & a_{1n} \\ a_{21} & a_{22} & \cdots & a_{2n} \\ \vdots & \vdots & \ddots & \vdots \\ a_{m1} & a_{m2} & \cdots & a_{mn} \end{bmatrix} \quad \text{Mathematical expression 4}$$

As a result, one integer included in the exponential matrix corresponds to the circulant permutation matrix in the parity check matrix, and thus, for convenience, the exponential matrix may be expressed by sequences composed of integers (the sequence may also be called an LDPC sequence or an LDPC code sequence for discrimination firm other sequences). In general, the parity check matrix can be expressed by not only the exponential matrix but also a sequence having algebraically the same characteristic. In the disclosure, for convenience, the parity check matrix is expressed as a sequence indicating the location of "1" in the exponential matrix or the parity check matrix. However, there are various sequence inscription methods capable of discriminating the location of "1" or "0" included in the parity check matrix, and the parity check matrix may be indicated in the form of various sequences having algebraically the same effect without being limited to the method expressed in the description.

Further, although even a transmission/reception device on a device may perform LDPC encoding and decoding by directly generating the parity check matrix, it may also perform the LDPC encoding and decoding using an exponential matrix or a sequence having algebraically the same effect as that of the parity check matrix in accordance with implementation features. In the disclosure, for convenience, although the encoding and decoding using the parity check matrix has been described, it may be considered that on the actual device, the encoding and decoding can be implemented though various methods capable of obtaining the same effect as the effect of the parity check matrix.

For reference, algebraically the same effect means that it is possible to explain or convert two or more different expressions so that they are perfectly the same as each other in logic or mathematics.

In the disclosure, for convenience, only a case where one circulant permutation matrix corresponds to one block has been explained. However, the disclosure can be applied in the same manner even in the case where several circulant permutation matrices are included in one block. For example, as in the following mathematical expression 5, if a sum of two circulant permutation matrices $P^{a_{ij}(1)}$, $P^{a_{ij}(2)}$ is included in the location of one i-th row block and j-th column block, the exponential matrix may be indicated as in the mathematical expression 6. With reference to the mathematical expression 6, it can be seen that the exponential matrix is a matrix in which two integers correspond to the i-th row and the j-th column corresponding to the row blocks and the column blocks including the sum of the plurality of circulant permutation matrices.

$$H = \begin{bmatrix} \ddots & \square & \square & \cdot^{\cdot} \\ \square & P^{a_{ij}(1)} + P^{a_{ij}(2)} & \square & \square \\ \square & & \square & \square \\ \cdot^{\cdot} & \square & \square & \ddots \end{bmatrix} \quad \text{Mathematical expression 5}$$

$$E(H) = \begin{bmatrix} \ddots & \square & \square & \cdot^{\cdot} \\ \square & (a_{ij}^{(1)}, a_{ij}^{(2)}) & \square & \square \\ \square & & \square & \square \\ \cdot^{\cdot} & \square & \square & \ddots \end{bmatrix} \quad \text{Mathematical expression 6}$$

As in the above-described embodiment, in general, in the QC-LDPC code, a plurality of circulant permutation matrices may correspond to one row block and a column block in the parity check matrix, and in the disclosure, for convenience, only a case where one circulant permutation matrix corresponds to one block will be described, but the gist of the disclosure is not limited thereto. For reference, a matrix having a size of L×L in which a plurality of circulant permutation matrices overlap one row block and column block is called a circulant matrix (or circulant).

Meanwhile, a mother matrix or abase matrix for the parity check matrix and the exponential matrix in the mathematical expressions 5 and 6 means a binary matrix having obtained by respectively replacing each circulant permutation matrix and zero matrix by "1" and "0" in a similar manner to the definition used in the mathematical expression 3, and it may be replaced by the sum of the plurality of circulant permutation matrices included in one block or simply by "1".

Next, a method for transmitting data using the QC-LDPC code is proposed. In the disclosure, for easy understanding, a case where the QC LDPC code is used as the channel code in order to transmit the data without error will be described, but it can be applied to any channel code generally satisfying the quasi-cyclic property.

First, for convenience in explanation, it is assumed that the parity check matrix H of the QC LDPC code composed of the quasi-cyclic matrix having a size of L×L as in the mathematical expression 3 is composed of $n_b$ column blocks and $m_b$ row blocks. Further, the codeword c for the parity check matrix H is expressed as in the following mathematical expression 7.

$$c=(c_0,c_1,c_2,\ldots,c_{n_b-1}),$$

$$c_i=(c_{i\times L},c_{i\times L+1},\ldots,c_{i\times L+L-1}), i=0,1,2,\ldots,n_b-1 \quad \text{Mathematical expression 7}$$

The codeword c clearly satisfies $H \cdot c^T = 0$.

Next, it is assumed that messages to be transmitted from a transmitter to a receiver are $m_0$, $m_1$, and so on. The messages may be defined by various values, and for example, the $T_{max}$ messages may be different binary vectors, integers, or in the form of texts. Further, the messages may be order or time indexes, synchronization signal block indexes (SS block indexes), synchronization signal block time indexes (SS block time indexes), system frame numbers, or predetermined different pieces of data.

Now, the messages are mapped onto integers as in the following mathematical expression 8.

$i) f:m_a \to \mathbb{Z}, a=0,1,2,\ldots,T_{max}-1, \mathbb{Z}$ is a set of integers $ii) m_a \neq m_b \Rightarrow f(m_a) \neq f(m_b)$ (i.e., $f$ is an injective function or one-to-one function)  Mathematical expression 8

In summary, in the case of applying in advance a proper rule to $T_{max}$ pieces of data intended to be transmitted, they may be expressed by $T_{max}$ integers. If the messages themselves are integers, the mapping in the mathematical expression 8 can be omitted. For example, in the case of messages $m_0=0$, $m_1=1$, . . . , and $m_{T_{max}-1}=T_{max}-1$, the messages themselves are integers, and thus the process of making a certain message correspond to an integer can be omitted.

As described above, $T_{max}$ pieces of data can always be expressed by $T_{max}$ integers, and in the following description, for convenience in explanation, it is assumed that messages composed of integers are transmitted unless specially mentioned otherwise. More specifically, it is assumed that the messages intended to be sent are $m_0=0$, $m_1=1$, . . . , and $m_{T_{max}-1}=T_{max}-1$. As described above, it is to be noted that the messages may indicate time indexes, SS block indexes, SS block time indexes, system frame numbers, or predetermined different pieces of data.

Prior to the explanation of the method for transmitting the integer message, a converter $T_x(\cdot)$ for converting the codeword c or information word s of a certain QC LDPC code as in the following mathematical expression 9 is defined.

i) $P$ is a circulant permutation matrix having a size of $L \times L$ ii) $C$ is a certain vector having a size of $L \times n$ iii) $T_x(c) \triangleq (P^{g(x)}c_0, P^{g(x)}c_1, P^{g(x)}c_2, \ldots, P^{g(x)}c_n)$, $T_x^{-1}(c) \triangleq (P^{-g(x)}c_0, P^{-g(x)}c_1, P^{-g(x)}c_2, \ldots, P^{-g(x)}c_n)$ $0 \leq x < L, 0 \leq x_1 < x_2 < \ldots < x_{T_{max}} < L, (t_{max} < L)$ iv) $\forall x_i, x_j, x_i \neq x_j \Rightarrow g(x_i) \neq g(x_j), 0 \leq g(x) < L$  Mathematical expression 9

It is to be noted that converters $T_x(\cdot)$ and $T_x^{-1}(\cdot)$ defined in the mathematical expression 9 are defined with respect to a certain vector c. That is, c may be a codeword, an information word s, or another real number vector r. $P^{g(x)}$ may serve to apply a quasi-cyclic shift in the unit of L bits. Further, it can be easily known $T_x^{-1}(T_x(c)) = T_x(T_x^{-1}(c)) = c$ is established with respect to a certain vector c. If $T_{x_i}(T_{x_j}(c)) = T_{x_j}(T_{x_i}(c)) = T_i x_j(c)$ is established with respect to certain $x_i$ and $x_j$, that is, if $g(x_1)+g(x_2)=g(x_1+x_2)$ is established, it is general that it becomes $g(0)=0$ and because $g(-x)=-g(x)$ is established, it may be indicated as $T_x^{-1}(c) = T_{-x}(c)$.

Further, g(x) may be defined in various forms, and as an embodiment of the disclosure, even a function as in the following mathematical expression 10 can be applied.

$g(x)=ax(\bmod L)$, where, $a$ is an integer that is relatively prime to $L$  Mathematical expression 10

In the disclosure, for convenience in explanation, the quasi-cyclic shift is expressed using a mathematical expression, such as $P^{g(x)}$, but in an actual transmitter or receiver device, it is to be noted that the quasi-cyclic shift can be easily implemented through a circular bit shift orbit rotation.

In the disclosure, for convenience in explanation, unless specifically mentioned otherwise, explanation can be made using $g(x)=-x$ (where, $a=-1$) or $g(x)=x(\bmod L)$ (where, $a=1$) among functions satisfying the mathematical expression 10, but it is not necessary to limit the disclosure thereto.

Simple examples of the disclosure for the mathematical expressions 9 and 10 are indicated in the following mathematical expression 11.

$g(x)=-x, L=4, c=(c_0,c_1,c_2,c_3),$ $c_0=(1,0,0,1), c_1=(0,0,0,1), c_2=(0,1,0,1), c_3=(1,1,1,0)$ $T_0(c)=(1,0,0,1{:}0,0,0,1{:}0,1,0,1{:}1,1,1,0)=c,$ $T_1(c)=(1,1,0,0{:}1,0,0,0{:}1,0,1,0{:}0,1,1,1),$ $T_2(c)=(0,1,1,0{:}0,1,0,0{:}0,1,0,1{:}1,0,1,1).$ $T_3(c)=(00,1,1{:}0,0,1,0{:}1,0,1,0{:}1,1,0,1),$  Mathematical expression 11

Next the algebraic characteristic of $T_x(\cdot)$ defined in the mathematical expression 9 will be described. If the QC LDPC code defined in the purity check matrix H is expressed as $\mathcal{C}$, it can be easily identified that the relationship of the following mathematical expression 12 is established with respect to a given codeword c.

Mathematical expression 12

$$c \in \mathcal{C} \Rightarrow,$$

$$O = H \cdot c^T = \begin{bmatrix} P^{e_{11}} & P^{e_{12}} & \cdots & P^{e_{1k_b}} & \cdots & P^{e_{1n_b}} \\ P^{e_{21}} & P^{e_{22}} & \cdots & P^{e_{2k_b}} & \cdots & P^{e_{2n_b}} \\ \vdots & \vdots & \ddots & \vdots & \ddots & \vdots \\ P^{e_{m_b1}} & P^{e_{m_b2}} & \cdots & P^{e_{m_bk_b}} & \cdots & P^{e_{m_bn_b}} \end{bmatrix} \begin{pmatrix} c_0 \\ c_1 \\ \vdots \\ c_{n_b-1} \end{pmatrix},$$

$$\Rightarrow H \cdot (T_x(c))^T,$$

$$= H \cdot \begin{pmatrix} P^{ax}c_0 \\ P^{ax}c_1 \\ \vdots \\ P^{ax}c_{n_b-1} \end{pmatrix} =$$

$$H \cdot \begin{bmatrix} P^{ax} & O & \cdots & O \\ O & P^{ax} & \cdots & O \\ \vdots & \vdots & \ddots & \vdots \\ O & O & \cdots & P^{ax} \end{bmatrix} \cdot \begin{pmatrix} c_0 \\ c_1 \\ \vdots \\ c_{n_b-1} \end{pmatrix},$$

$$= \begin{bmatrix} P^{e_{11}+ax} & P^{e_{12}+ax} & \cdots & P^{e_{1k_b}+ax} & \cdots & P^{e_{1n_b}+ax} \\ P^{e_{21}+ax} & P^{e_{22}+ax} & \cdots & P^{e_{1k_b}+ax} & \cdots & P^{e_{2n_b}+ax} \\ \vdots & \vdots & \ddots & \vdots & \ddots & \vdots \\ P^{e_{m_b1}+ax} & P^{e_{m_b2}+ax} & \cdots & P^{e_{m_bk_b}+ax} & \cdots & P^{e_{m_bn_b}+ax} \end{bmatrix} \cdot \begin{pmatrix} c_0 \\ c_1 \\ \vdots \\ c_{n_b-1} \end{pmatrix}$$

$$= \begin{bmatrix} P^{ax} & O & \cdots & O \\ O & P^{ax} & \cdots & O \\ \vdots & \vdots & \ddots & \vdots \\ O & O & \cdots & P^{ax} \end{bmatrix} \cdot H \cdot \begin{pmatrix} c_0 \\ c_1 \\ \vdots \\ c_{n_b-1} \end{pmatrix} = 0,$$

$$\Rightarrow T_x(c) \in \mathcal{C}.$$

In the mathematical expression 12, if $c \in \mathcal{C}$ is established, it can be known that $T_x(c) \in \mathcal{C}$ is also established. The above-described characteristic is called a quasi-cyclic, characteristic, and it may be simply summarized as in the following mathematical expression 13.

Mathematical Expression 13

(Quasi-Cyclic Characteristic)

A certain channel code satisfying the following condition with respect to a converter $T_x(\cdot)$ defined in the mathematical expression 9 is defined to satisfy the quasi-cyclic characteristic.

$$\forall c \in \mathcal{C} \Rightarrow T_x(c) \in \mathcal{C}$$

Further, if the quasi-cyclic characteristic is defined by a circulant permutation matrix having a size of L×L, it is called L-quasi-cyclic characteristic.

A method and an apparatus for transmitting a message (or data) corresponding to an integer using a channel code having the quasi-cyclic characteristic will be described though FIG. 3.

Figure 3:
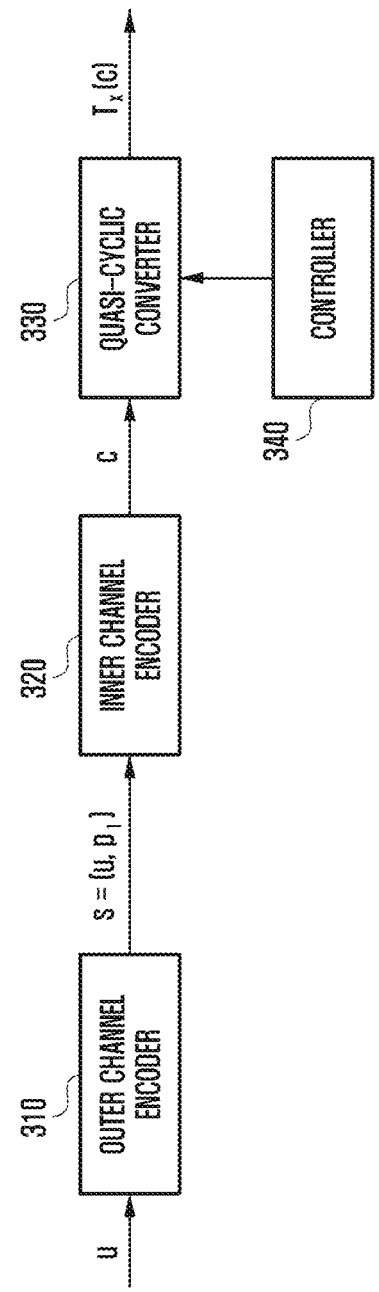
FIG. 3 is a block diagram of a transmission device according to an embodiment of the disclosure.

FIG. 3 is a block diagram of a transmission device according to an embodiment of the disclosure.

With reference to FIG. 3, it is first assumed that data u includes other information in addition to the message or data corresponding to the integer. First, a transmission device generates a first party bit $p_1$ by performing outer encoding of the data u though an outer channel encoder 310. As an outer channel code for the outer channel encoder 310, a general channel code capable of performing error detection, such as a cyclic redundancy check(CRC) code, a Bose-Chaudhuri-Hocquenghem (BCH) code, or a proper parity check code, may be used.

If it is assumed that $(u, p_1)$ is s, s means input bits (or input bit vectors) of an inner channel encoder 320. The transmission device generates a second panty bit $p_2$ by performing inner channel encoding of the input bits $(u, p_1)$ through the inner channel encoder 320. In the disclosure, the inner channel code for the inner channel encoder 320 is explained through applying of the QC LDPC code having the parity check matrix as in the mathematical expression 3, but in general, any channel code satisfying the quasi-cyclic characteristic of the mathematical expression 13 is applicable.

If the inner channel encoder 320 corresponds to the systematic channel code, the data u, the first parity, and the second parity become the codeword c for the inner channel encoder 320. In order to transmit the integer or the corresponding message through a quasi-cyclic converter 330, the transmission device properly applies the quasi-cyclic shift to the codeword c. A controller 340 controls to determine a value for quasi-cyclic-shifting the codeword c (quasi-cyclic value) g(x)(or x corresponding to this) in accordance with the integer or the corresponding message, and it controls to generate a quasi-cyclic-shifted codeword $T_x(c)$ to be transmitted by the transmitter by properly performing the quasi-cyclic shift through the quasi-cyclic converter 330.

Figure 4:
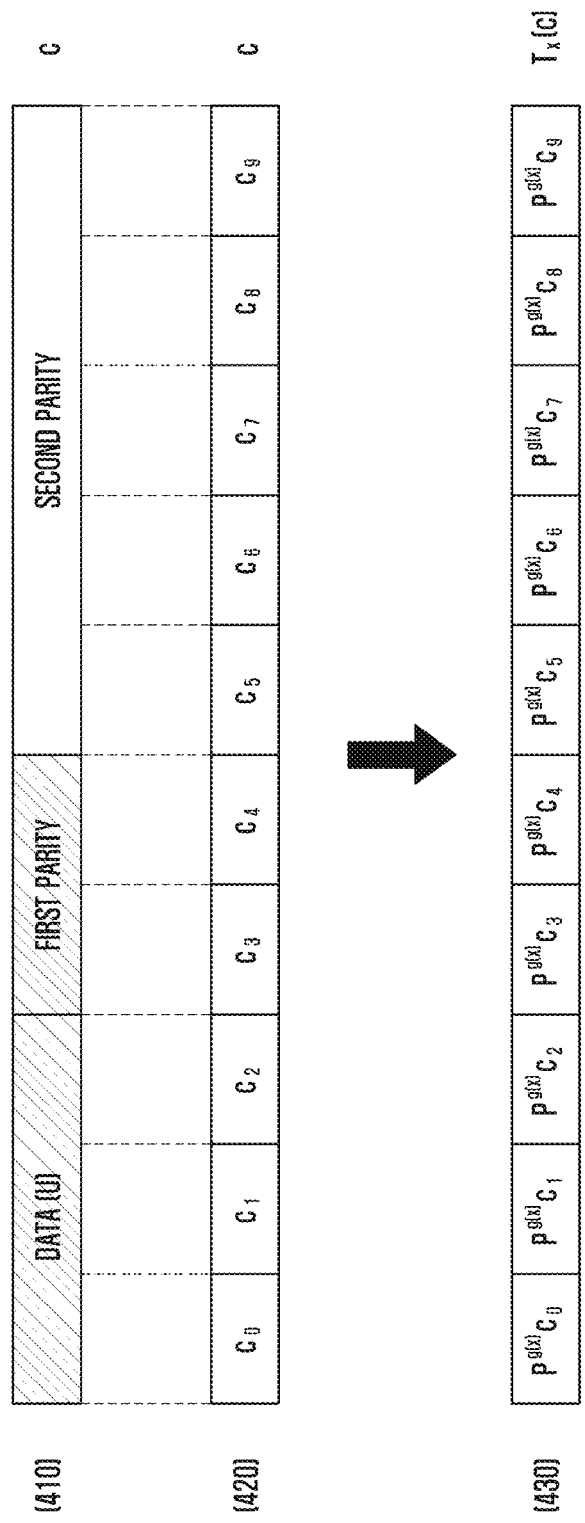
FIG. 4 is an exemplary diagram of a quasi-cyclic shift of a codeword according to an embodiment of the disclosure.

The process in accordance with the operation of FIG. 3 is simply illustrated in FIG. 4.

FIG. 4 is an exemplary diagram of a quasi-cyclic shift of a codeword according to an embodiment of the disclosure.

With reference to FIG. 4, a codeword bit 410 obtained from the inner channel encoder of FIG. 3 is divided in the unit of a length L as 420, and a quasi-cyclic conversion is performed as 430 to generate a codeword to be transmitted by the transmitter.

Figure 5:
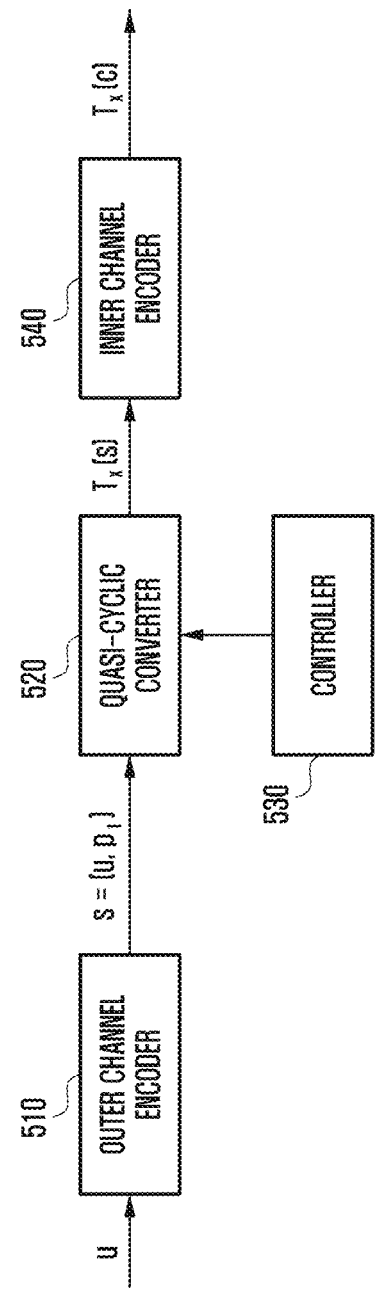
FIG. 5 is a block diagram of another transmission device according to an embodiment of the disclosure.

The operations indicated in FIGS. 3 and 4 can be realized also in a method as illustrated in FIG. 5. [00%] FIG. 5 is a block diagram of another transmission device according to an embodiment of the disclosure.

With reference to FIG. 5, a transmission device first generates a first parity bit $p_1$ by performing outer channel encoding of data u through an outer channel encoder 510. Next, in order to transmit an integer or a corresponding message through a quasi-cyclic converter 520, the transmission device properly applies quasi-cyclic conversion with respect to the data and the first parity bit $s = (u, p_1)$. In this case, a controller 530 controls to determine a value g(x)(or x corresponding to this) for quasi-cyclic-shifting the data and the first parity bit $s = (u, p_1)$ in accordance with the integer, the corresponding message, or the data, and to generate a quasi-cyclic-shifted $T_x(s)$ by properly performing the quasi-cyclic shift through the quasi-cyclic converter 520. Next, the transmission device receives an input of the quasi-cyclic-shifted data and the first parity bit, and it performs inner channel encoding through an inner channel encoder 540.

It is to be noted that the reason why the orders of the quasi-cyclic converter and the inner channel encoder are exchangeable in FIGS. 3 and 5 is that the inner channel code used in the inner channel encoder 320 or 540 satisfies the quasi-cyclic characteristic of the mathematical expression 13. In the disclosure, it is general that the outer channel code uses the channel code that does not satisfy the quasi-cyclic characteristic that is satisfied by the inner channel code, and in this case, the outer channel encoder and the quasi-cyclic converter are unable to change the orders though a simple exchange method indicated in FIG. 5, and it may be necessary to add separate specific processes.

Next, a method and an apparatus for decoding the data u and the quasi-cyclic-shifted value g(x)(or x corresponding to this)transmitted using the method and the apparatus as illustrated in FIGS. 3 to 5 through a receiver will be described with reference to FIG. 6.

Figure 6:
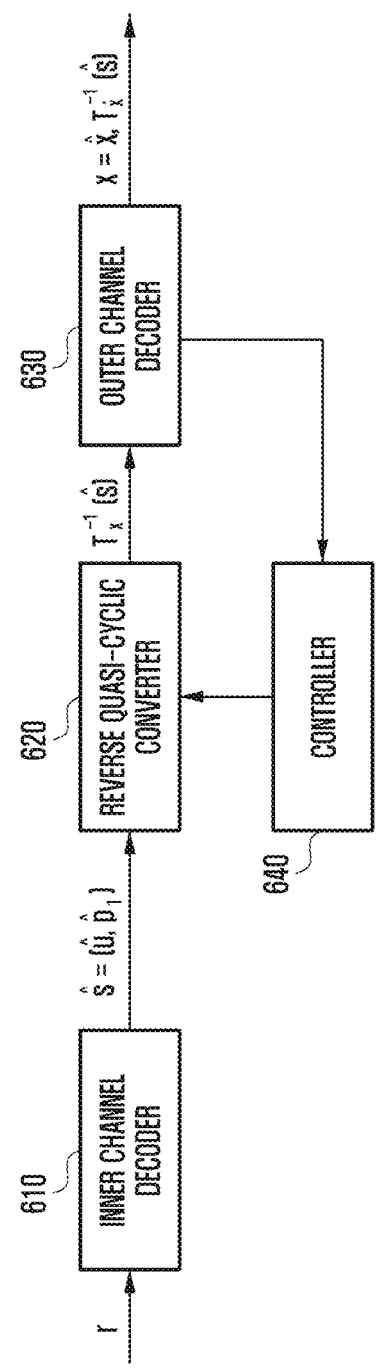
FIG. 6 is a block diagram of a reception device according to an embodiment of the disclosure.

FIG. 6 is a block diagram of a reception device according to an embodiment of the disclosure.

First, if a received signal r is received, a receiver performs decoding through an inner channel decoder 610. Here, it is to be noted that the inner channel decoder 610 is a channel decoder corresponding to an inner channel code being used in the inner channel encoder 320 or 540 of FIGS. 3 and 5. Because the channel code that satisfies the quasi-cyclic characteristic is applied, the transmitted signal corresponds to one of codewords of the inner channel code even if the transmitter does not know the applied quasi-cyclic shift value g(x)(or x corresponding to this), and thus the is no problem in performing the decoding using the inner channel decoder 610. In other words, the data decoded through the inner channel decoder 610 in FIG. 6 and the first parity $\hat{s}=(\hat{u}, \widehat{p_1})$ are obtained from a part of a legitimate codeword due to the quasi-cyclic characteristic of the inner channel code corresponding to the inner channel decoder 610.

However, because the outer channel code corresponding to the outer channel decoder 630 generally uses the channel code that does not satisfy the quasi-cyclic characteristic of the inner channel code corresponding to the inner channel decoder 610, it can restore the quasi-cyclic shift value g(x) (or x corresponding to this) and actual transmitted data from the ŝ. Here, it is to be noted that the outer channel decoder 610 is a channel decoder corresponding to the outer channel code being used in the outer channel encoders 310 and 510 in FIGS. 3 and 5, and the outer channel code has an error detection capability.

The data restored by the inner channel decoder 610 and the first parity $\hat{s}=(\hat{u},\widehat{p_1})$ are quasi-cyclic-shifted through a quasi-cyclic converter 620. If the result of applying the reverse quasi-cyclic shift for x to ŝ is $T_x^{-1}(\hat{s})$, the reception device receives the quasi-cyclic-shifted $T_x^{-1}(\hat{s})$ as an input, and it performs decoding through the outer channel decoder 630. Here, x may be in the range of O≤x<L as defined in the mathematical expression 9, and if the reverse quasi-cyclic shift value g(x) (or x) does not coincide with the value transmitted from the actual transmitter, there is a high possibility that the outer channel decoder 630 detects an error. If the error is detected as described above, the same process is repeated as the reverse quasi-cyclic shift value is changed through the controller 640. This process is repeated until the error is not detected by the outer channel decoder 630, and in the case of x=$\hat{x}$, the outer channel decoder 630 may output x=$\hat{x}$ and the corresponding result of the reverse quasi-cyclic shift $T_x^{-1}(\hat{s})$ if no error is determined through the outer channel decoder 630. As a result, the receiver can decode the quasi-cyclic-shifted value g(x) (or x corresponding to this) and the data u transmitted from the transmitter through the decoding process of FIG. 6.

If $g(x_1)+g(X_2)=g(X_1+x_2)$ is established with respect to certain $x_i$ and $x_j$, it is general that it becomes g(0)=0, and because g(-x)=-g(x) is established, it may be indicated as $T_x^{-1}(c)=T_{-x}(c)$. Accordingly, it is to be noted that the reverse quasi-cyclic shift can be easily implemented using the quasi-cyclic shift according to circumstances. In general, even if $g(x_1)+g(x_2)=x_1+x_2)$ is not established, the reverse quasi-cyclic shift can be implemented through the quasi-cyclic shift, but complexity is somewhat increased in implementation. Hereinafter, in the disclosure, although the receiver operation and the explanation of the device diagram are expressed based on the reverse quasi-cyclic shift for convenience, it is to be noted that the reverse quasi-cyclic converter or shift can be implemented by the quasi-cyclic converter or shift according to circumstances. Basically, it may be considered that the quasi-cyclic converter and the reverse quasi-cyclic converter can be implemented in a crossing manner, but different shift values am applied thereto.

The decoding process indicated in FIG. 6 will be described in detail though a flowchart of FIG. 7.

Figure 7:
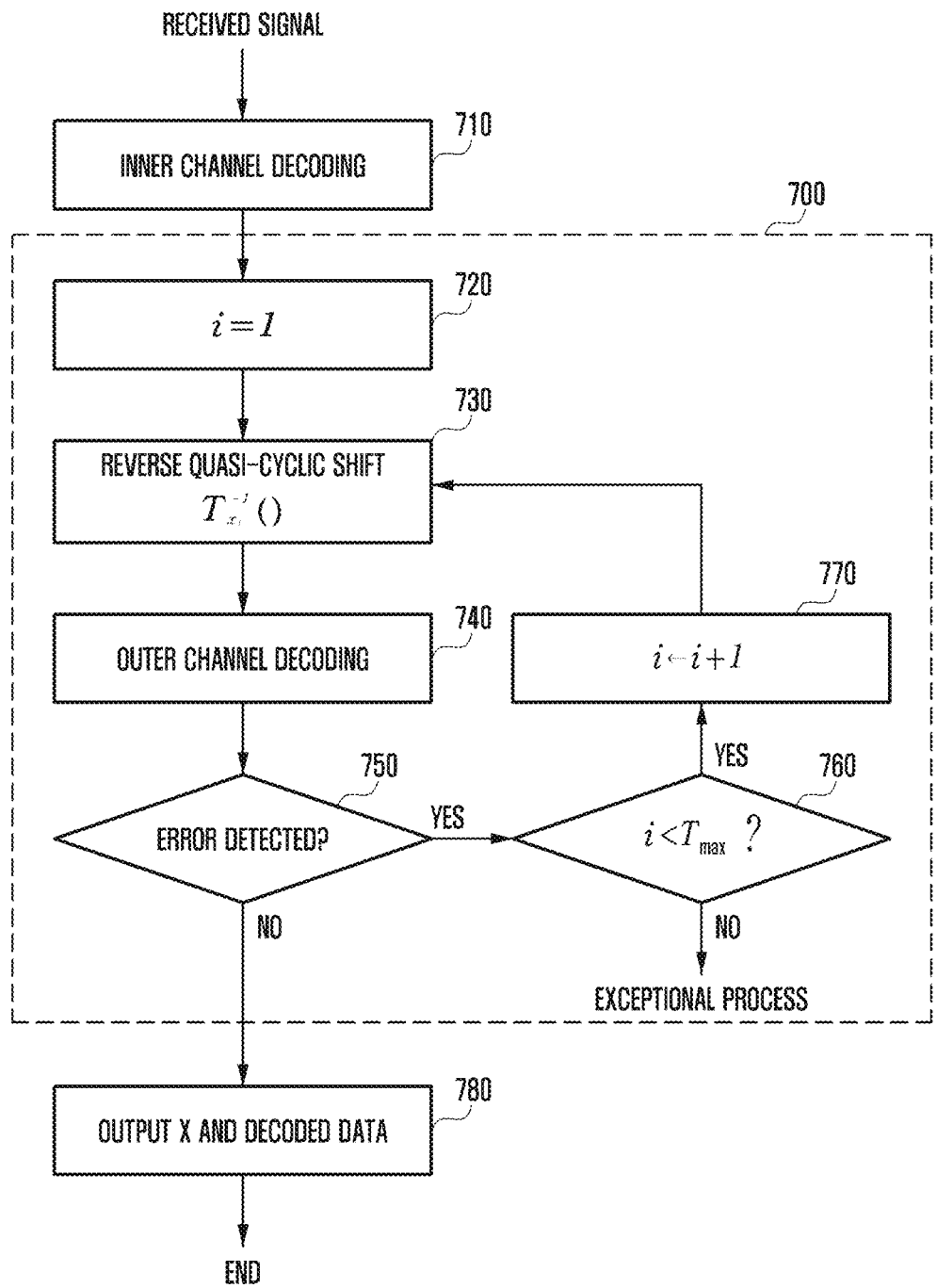
FIG. 7 is an exemplary flowchart of a decoding process according to an embodiment of the disclosure.

FIG. 7 is an exemplary flowchart of a decoding process according to an embodiment of the disclosure.

First, a receiver performs inner channel decoding 710 of a received signal. If the inner channel decoding 710 is completed, the receiver should perform quasi-cyclic shift with respect to decoded data obtained through the decoding operation and a first parity bit. In an embodiment illustrated in FIG. 7, at operation 720, an initial value for the quasi-cyclic shift is set to i=1, but it can be changed in accordance with requirements of the system.

The receiver applies the quasi-cyclic shift $T_x^-(\cdot)$ with respect to the data decoded at operation 710 and the first parity bit at operation 730, and then it preforms outer channel decoding based on the result of the quasi-cyclic shift at operation 740. After completing the outer channel decoding at operation 740, the receiver, at operation 750, iteratively performs the quasi-cyclic shift at operation 730 by applying the operations 760 and 770 until the value of i reaches $T_{max}$ the determination basis at operation 760 can also be changed in accordance with the initial value set at operation 720).

If an error is not detected at operation 750, the receiver, at operation 780, outputs x corresponding to the quasi-cyclic shift value g(x) applied to the outer channel decoding at operation 740 and the decoded data to end the operation.

If the error is continuously detected even after the value of i reaches $T_{max}$, the receiver, at operation 760, may determine that the decoding has failed, and it may output x corresponding to the proper quasi-cyclic shift value g(x) and the decoded data from which it is determined that the error is detected in accordance with a predetermined rule.

As described above, the outer channel code for the outer channel decoding of FIG. 7 can perform the error detection, but any channel code that does not satisfy the quasi-cyclic characteristic satisfied by the inner channel code for the inner channel decoding is applicable. In general, various linear block codes, such as a CRC code, a BCH code, or a proper parity check code, can be applied.

As described above, in FIGS. 6 and 7, only a case where $T_x^{-1}(\cdot)$ is applied at operation 730 for the quasi-cyclic shift for x has been described, but implementation can be made using $T_x^{-1}(\cdot)$ or $T_x(\cdot)$. In the case of implementation using $T_x(\cdot)$ types of output values at operation 760, 770, or 780 of FIG. 7 may be somewhat changed.

Next, in order to explain another embodiment of the disclosure, a communication or broadcast system satisfying the following conditions is assumed.

Condition 1) The transmitter intends to iteratively transmit the data u.

Condition 2) Because it should be possible for the receiver to perform not only the data decoding but also the decoding of the data order or the location x on a frame including the data, the corresponding codeword should include information on the data order or the location x when the codeword is generated with respect to the data u through the channel code. Here, the data order or the location on the frame can be transferred in various forms, such as time indexes, SS block indexes, SS block time indexes, or system frame numbers.

Condition 3) For convenience, the data order or the location on the frame is expressed by an integer, and it may presented as $x_1$, $x_2$, and so on (where, $0 \leq x_1 < x_2 < \ldots < x_{T_{max}} < L$).

Condition 4) In general, due to the decoding failure, the receiver is unable to know $x_i$ and $x_j (x_i < x_j)$, but it is able to know their difference $\Delta x_{ij} = x_j - x_i$.

Condition 5) Even if the decoding of respective codewords has failed, a channel encoding/decoding method should be applied, which provides a method capable of heightening possibility of decoding success through proper combining of received signals corresponding to the codewords. In this case, a difference value $\Delta x$ between the data orders or locations may be used.

The communication or broadcast system satisfying all the conditions 1) to 5) can be applied in the case where a beamforming based communication or broadcast system transmits specific data. Because the contents of the system requiring the above-described conditions 1) to 5) deviate from the subject matter of the disclosure, the detailed explanation thereof will be omitted.

In general, in order to realize a communication and broadcast systems satisfying the conditions 1) to 3), blind decoding is frequently used. For example, the blind decoding is a method for performing decoding until the decoding success is found as applying one-by-one values of possible data orders or locations x from the received signals. However, the inner channel code corresponding to the inner channel encoder of FIGS. 3 to 5 and the inner channel decoder of FIG. 7 has superior performance, but it frequently uses channel codes (LDPC, polar, and turbo codes) having very high decoding complexity. Accordingly, in the case of performing the blind decoding of the channel codes, the decoding complexity of the system becomes very high, and decoding latency may also cause a problem.

In contrast with this, it can be known that the system satisfying the conditions 1) to 3) can easily achieve the decoding using the method and the apparatus as described above with reference to FIGS. 3 to 7. The disclosure proposed in FIGS. 3 to 7 does not perform the blind decoding of the inner channel code corresponding to the inner channel encoder of FIGS. 3 and 5 or the inner channel decoder of FIG. 7. However, the disclosure performs the blind decoding only with respect to the outer channel code corresponding to the outer channel encoder of FIGS. 3 and 5 or the outer channel decoder of FIG. 7, and in general, because the channel code of which hard-decision decoding, such as the CRC code, the BCH code, or parity check code, is possible is frequently applied, the disclosure provides the complexity and decoding latency that can be disregarded as compared with the existing method.

Another embodiment of the disclosure to be described hereinafter provides a method and an apparatus for efficiently realizing a system that satisfies not only the conditions 1) to 3) but also the conditions 4) and 5).

First, for convenience in explanation, it is assumed that data u is transmitted to two codewords of a given channel code, respectively, and the orders or the locations of the respective codewords are $x_1$, $x_2 (x_1 < x_2)$. Further, it is assumed to apply the quasi-cyclic conversion defined through the mathematical expressions 9 and 10. In the disclosure, for convenience in explanation, it is assumed that the order or location information is transmitted through an embodiment of the disclosure proposed in FIGS. 3 to 7 by making the order or location information correspond to the quasi-cyclic shift values $ax_1 (\text{mod } L)$, $ax_2 (\text{mod } L)$ but the disclosure is not limited thereto.

In addition, in the receiver, it is assumed that the order or location values $x_1$, $x_2$ are unable to be known before the codewords are decoded, but $\Delta = x_2 - x_1$ is able to be known by the receiver before the codewords am decoded. In this embodiment, for convenience, explanation will be made only in the case where the order or location values are transmitted to two codewords, respectively, but in general, they can be easily extended with respect to a case where they have different orders or locations, and they are transmitted through two or more codewords.

Figure 8:
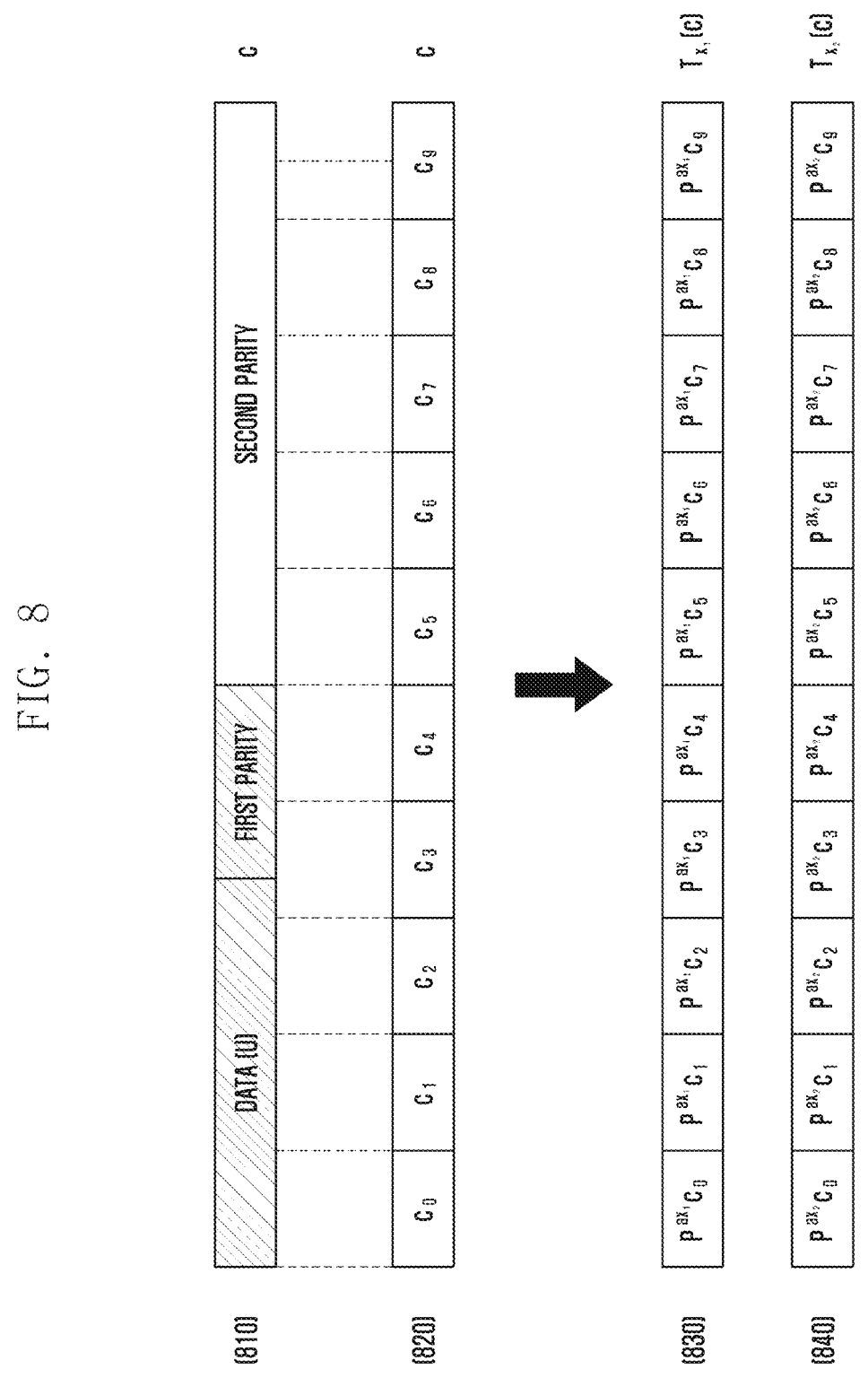

FIG. 8 is another exemplary diagram of a quasi-cyclic shift of a codeword according to an embodiment of the disclosure.

As illustrated in FIG. 8, a transmission device first generates a first parity through an outer channel encoder to generate a codeword c 810 with respect to given data u, and it generates a second parity through an inner encoder. Next, in order to apply a quasi-cyclic shift to the codeword c 810 in the unit of L bits, the transmission device performs grouping of codeword bits in the unit of L bits. Next the transmission device applies a quasi-cyclic conversion corresponding to quasi-cyclic shift values $ax_1 (\text{mod } L)$ $ax_2 (\text{mod } L)$ to the codeword c 810, and then it transmits respective codewords $T_{x_1}(c)$ 830 and $T_{x_2}(c)$ 840.

If decoding of any one codeword has succeeded after the receiver receives signals for the respective codewords, any one value of $x_1$ and $x_2$ can be decoded, and because the value $\Delta x = x_2 - x_1$ has been known, all of u, $x_1$, and $x_2$ can be decoded. However, if decoding of the two codewords has failed, the decoding can be performed again by discarding or combining all the signals for the two codewords. In the disclosure, a method for increasing the decoding possibility by performing the decoding again through the combining is proposed.

First, as shown in FIG. 8, in the case where the transmitter generates and transmits codewords $T_{x_1}(c)$ 830 and $T_{x_2}(c)$ 840, features as expressed in the following mathematical expression 14 due to linearity of a function for the quasi-cyclic shift defined in the mathematical expression 10.

$$1) P^{ax_2} c_i = P^{a(x_1 + \Delta x)} c_i = P^{a\Delta x}(P^{ax_1} c_i) \text{ or } P^{ax_1} c_i = P^{-a\Delta x}(P^{ax_2} c_i)$$

$$2) T_{x_2}(c) = T_{\Delta x}(T_{x_1}(c)) \text{ or } T_{x_1}(c) = T_{-\Delta x}(T_{x_2}(c)) = T_{\Delta x}^{-1}(T_{x_2}(c))$$

Mathematical expression 14

Figure 9:
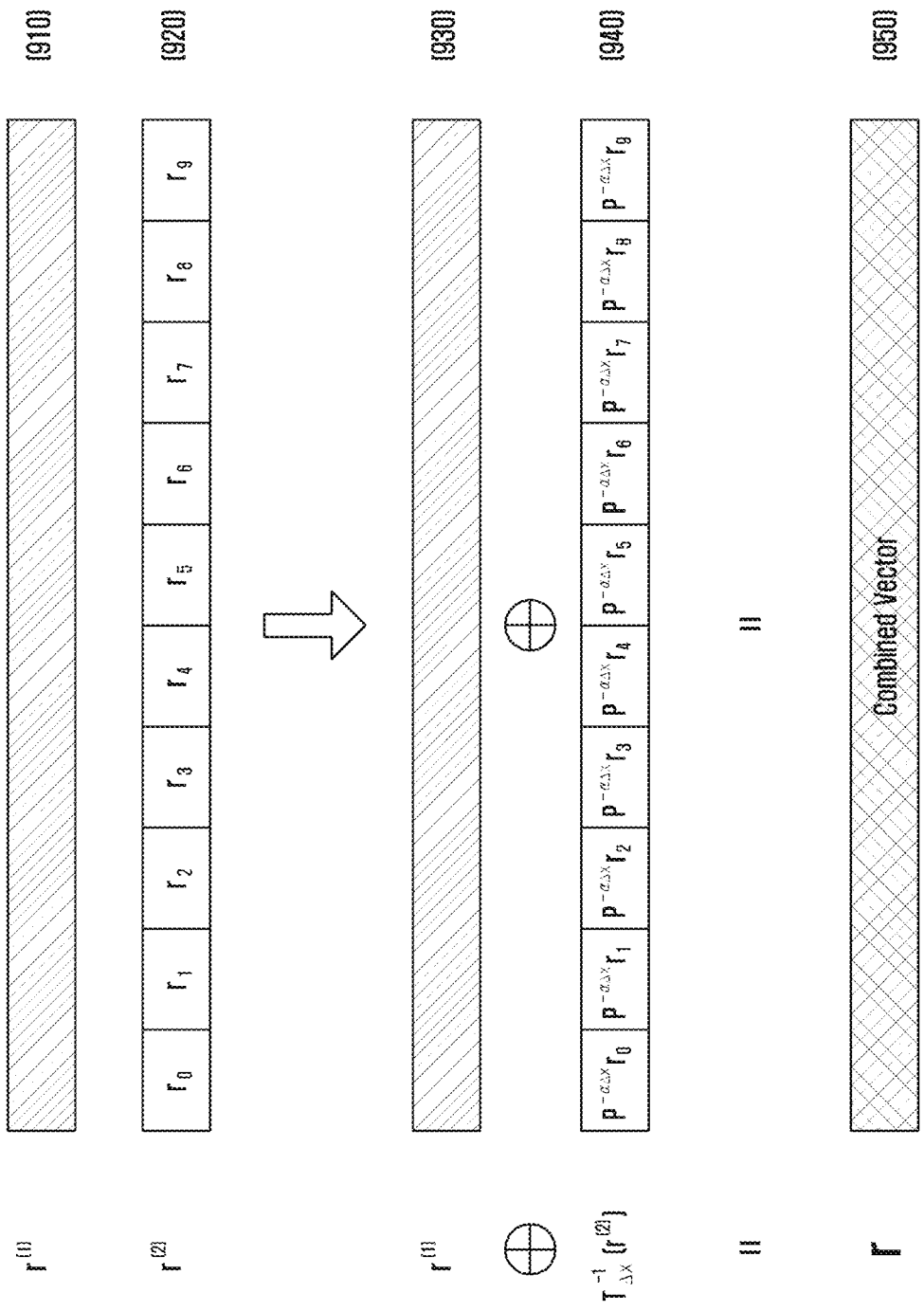
FIG. 9 is an exemplary diagram explaining a method for combining received signals according to an embodiment of the disclosure.

Using the features in the mathematical expression 14, it is possible to efficiently combine received signals corresponding to two codewords as shown in FIG. 9. In FIG. 9, 910 and 920 indicate received log likelihood ratio (LLR) vectors $r^{(1)}$ and $r^{(2)}$ for the codewords $T_{x_1}(c)$ 830 and $T_{x_2}(c)$ 840, respectively. In the disclosure, for convenience, explanation will be made using the LLR vectors, but it is not necessary to limit the disclosure thereto because the received vectors can be expressed in various forms.

Because the receiver knows $\Delta x$, and the two transmitted codewords satisfy the property of the mathematical expression 14, it is effected to obtain the LLR vector for the same codeword as that of the received LLR vector $r^{(1)}$ by applying $T_{\Delta x}^{-1}(r^{(2)})$ (or $T_{\Delta x}(r^{(2)})$) with respect to the received LLR vector $r^{(2)}$ as denoted as 940 of FIG. 9. Accordingly, if the decoding is performed using the LLR vector r 950 obtained by combining the received LLR vector $r^{(1)}$ and the LLR vector $T_{\Delta x}^{-1}(r^{(2)})$ )(or $T_{-\Delta x}(r^{(2)})$) to which the reverse quasi-cyclic shift is applied with each other, an effect in which one codeword is repeatedly transmitted can be obtained. In this case, it is typically well-know that an encoding gain of 3 dB or more is obtained.

The combined LLR vectors perform the decoding using the inner channel code as in FIGS. 3 to 7. If the decoding is performed using the inner channel code, there is a high probability that the decoding has succeeded in accordance with the iterative transmission (or code) effect. However, in order to decode not only $x_1$ or $x_2$ but also the transmitted data, the additional reverse quasi-cyclic shift and the outer channel decoding as shown in FIGS. 6 and 7 should be performed. For example, if it is considered that the codeword is decoded using the inner channel code from the LLR vector 950, the reception device can obtain a decoding value $\hat{x}_1$ for $x_1$ through the operations 720 to 780 of FIG. 7 from the decoded codeword ($x_1 = \hat{x}_1$). Accordingly, the receiver knows $\Delta x$, and thus it can also obtain the decoding value $\hat{x}_2 = \hat{x}_1 + \Delta x$, for $\hat{x}_2$. At the same time, as described above with reference to FIGS. 6 and 7, the transmitted data is decoded together. For reference, a case where the reverse quasi-cyclic shift is first applied to the received LLR vector $r^{(2)}$ has been described, but it is to be noted that the decoding is possible through a similar process by first applying the quasi-cyclic shift to $r^{(1)}$ together with $T_{\Delta x} r^{(1)}$. In this case, the receiver may first decode $\hat{x}_2$, and then it may obtain $\hat{x}_1$ using $\hat{x}_1 = \hat{x}_2 - \Delta x$.

The above-described process will be described in detail through FIG. 10.

Figure 10:
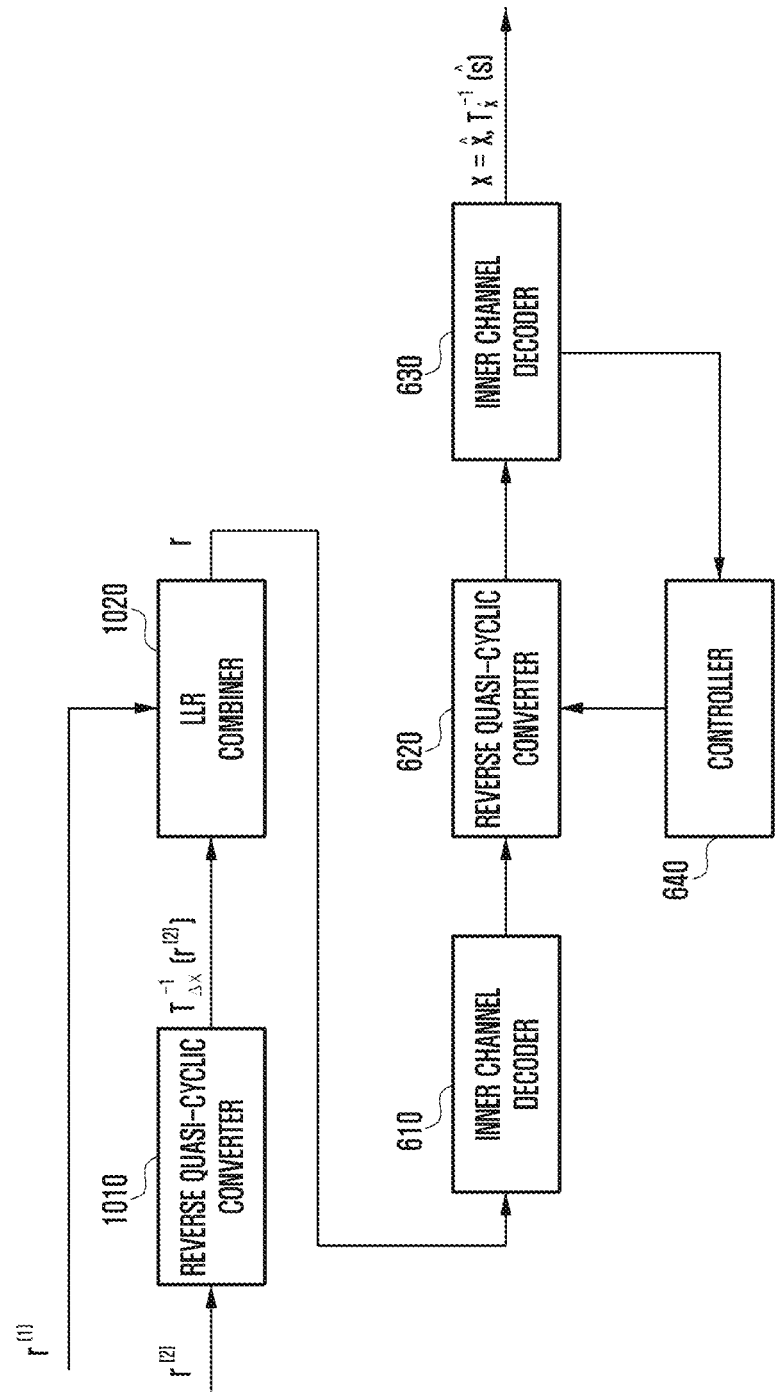
FIG. 10 is a block diagram of a reception device based on combination of received signals according to an embodiment of the disclosure.

FIG. 10 is a block diagram of a reception device based on combination of received signals according to an embodiment of the disclosure.

First, if there are received signals (or received vectors) $r^{(1)}$ and $r^{(2)}$ a reception device first obtains $T_{\Delta x}^{-1}(r^{(2)})$ (or $T_{\Delta x}(r^{(2)})$) with respect to $r^{(2)}$ through a reverse quasi-cyclic converter 1010, combines $r^{(1)}$ and $T_{\Delta x}^{-1}(r^{(2)})$ (or $T_{\Delta x}(r^{(2)})$) through an LLR combiner 1020, and inputs the LLR vector r obtained from the result to the decoding apparatus of FIG. 6 to perform decoding (for reference, in the case of applying the conversion to a first received signal having a faster data order or location, the quasi-cyclic converter 1010 may use the same module as that of the quasi-cyclic converter as described above with reference to FIGS. 6 and 7. The following process is the same as the decoding process as described above through FIGS. 6 and 7. Here, it is to be noted that the LLR combiner 1020 can be changed to another type of combiner if the received signals (or received vectors) are not configured as the LLR For example, in the case of the LLR vector, the LLR combiner 1020 may be configured as a simple sum, whereas in the case of being expressed as respective probability vectors for binary values 0 and 1 rather than the LLR vector, the configuration may be changed based on a more complex operation. Further, the reverse quasi-cyclic converters 1010 and 620 may use different modules or the same modules. Further, as described above, it is to be noted that $T_{\Delta x}(r^{(1)})$ may be first obtained with respect to $r^{(1)}$ through the quasi-cyclic converter, $T_{\Delta x}(r^{(1)})$ and $r^{(2)}$ may be combined with each other through the LLR combiner 1020, and the LLR vector r obtained from the result may be input to the decoding apparatus of FIG. 6 to perform the decoding.

Figure 11:
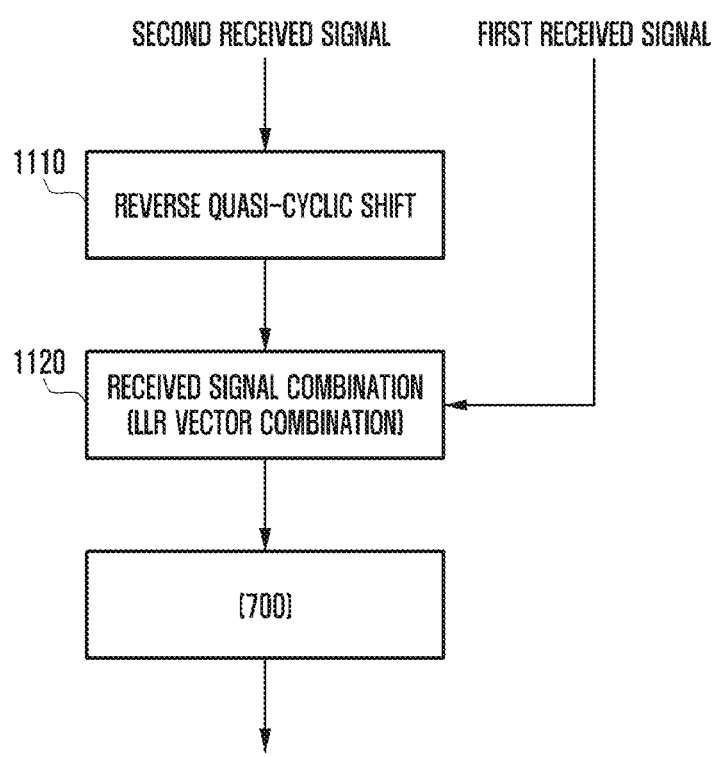
FIG. 11 is an exemplary flowchart of a decoding process based on combination of received signals according to an embodiment of the disclosure.

The above-described decoding process will be simply described through a flowchart of FIG. 11.

FIG. 11 is an exemplary flowchart of a decoding process based on combination of received signals according to an embodiment of the disclosure.

First it is assumed that the first received signal $r^{(1)}$ (or received vector) and the second received signal $r^{(2)}$ (or received vector) are given with respect to two codewords transmitted from the transmitter, decoding of the respective received signals has failed. If the decoding has failed with respect to all the received signals, a reception device first applies $T_{\Delta x}^{-1}(\cdot)$ (or $T_{\Delta x}(\cdot)$) to one of the two received signals through a reverse quasi-cyclic shift 1110 (With reference to FIG. 11, for convenience, a case where a reverse quasi-cyclic shift is applied to the second received signal will be described, but it can be implemented using a quasi-cyclic shift $T_{\Delta x}(\cdot)$. Further, it is to be noted that combination becomes possible after the quasi-cyclic shift $T_{\Delta x}(\cdot)$ is applied to the first received signal).

The reception device generates combined received signals (or received vectors) with respect to one codeword by properly combining the second received signal and the first received signal to which the reverse quasi-cyclic shift is applied at operation 1120. In this case, the reverse quasi-cyclic shift is performed based on the difference between the quasi-cyclic shift values for the two received signals. Next, based on the combined received signals (or mathematical expression vectors), the reception device performs decoding in accordance with the flowchart 700 of FIG. 7. If the decoding is completed in accordance with the flowchart of FIG. 7, not only the order or location information $x_1$ for data and $T_{x_1}(c)$ but also the order or location information $x_2$ for $T_{x_2}(c)$ can also be easily decoded.

As described above, in the disclosure, only a case where the transmitted or received signals correspond to the two codewords has been described, but easy extension becomes possible even in the case of 3 or more codewords.

Figure 12:
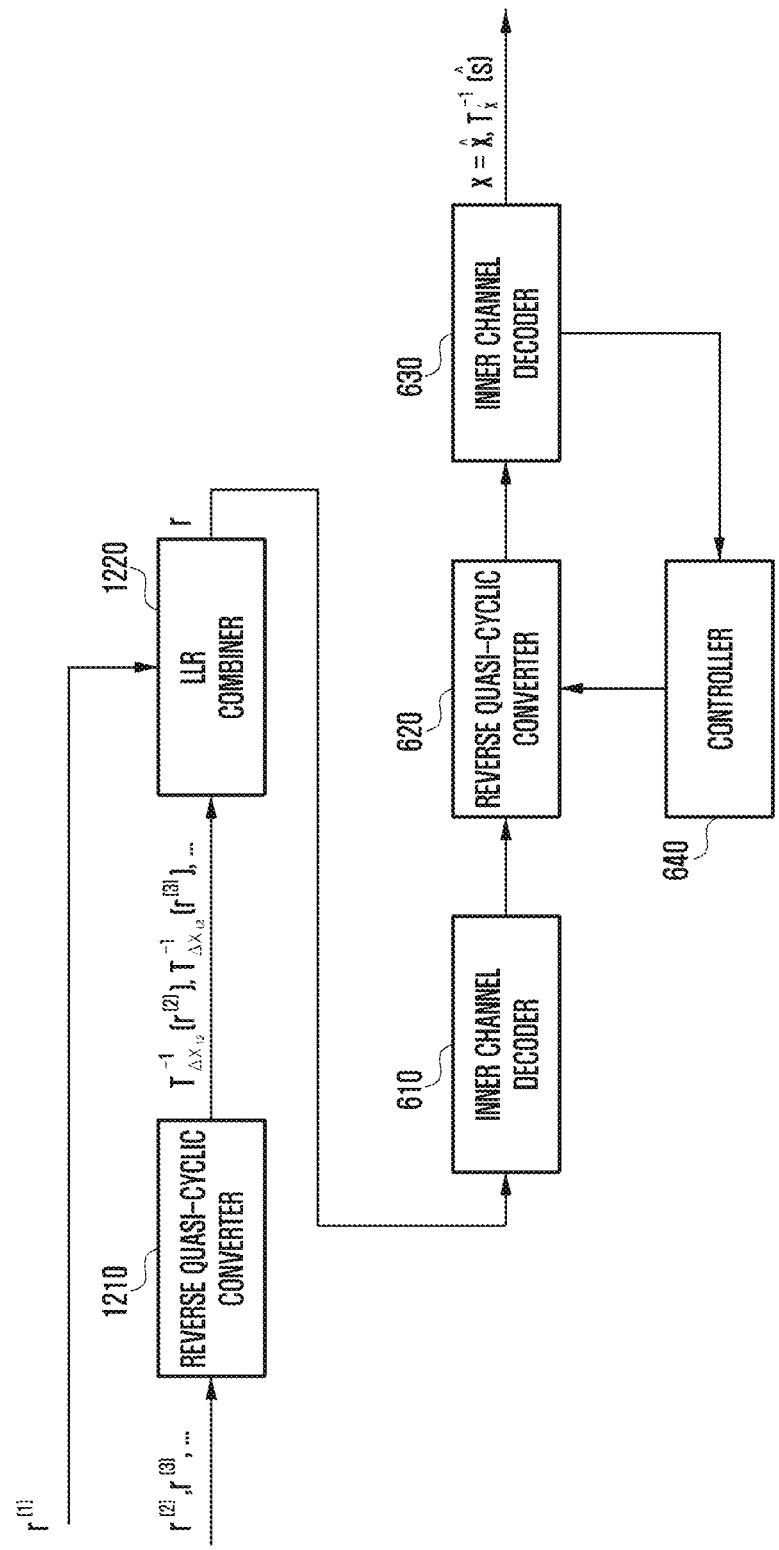
FIG. 12 is a block diagram of another reception device based on combination of received according to an embodiment of the disclosure.

FIG. 12 is a block diagram of another reception device based on combination of received according to an embodiment of the disclosure.

FIG. 12 shows an embodiment in which the block diagram of FIG. 10 is generalized with respect to 3 or more transmitted codewords or the corresponding received signals (or received vectors).

FIG. 12 will be described in detail as follows. First, it is assumed that there are 3 or more received signals (or received vectors) $r^{(1)}$, $r^{(2)}$, $r^{(3)}$, and soon, and if the order or location information in which codewords corresponding to the respective signals are transmitted is $x_1$, $x_2$, and $x_3$, a receiver already knows a difference between the order or location information. For example, the receiver knows the difference values, such as $\Delta x_{1,2} = x_2 - x_1$ or $\Delta x_{1,3} = x_3 - x_1$. In this case, the receiver first determines one received signal to be the basis of combination among the received signals, and in FIG. 12, for convenience, a case where the combination is made based on the first received signal $r^{(1)}$ corresponding to the first codeword will be described, but it is to be noted that the combination becomes possible based on other received signals.

By properly applying a revere quasi-cyclic shift with respect to the received signals $r^{(2)}$, $r^{(3)}$, and so on excluding the first received signal based on a difference between the orders or locations of the respective received signals through a reverse quasi-cyclic converter 1210, for example, the reception device applies $T_{\Delta x_{1,2}}^{-1}(r^{(2)})$ or $T_{\Delta x_{1,2}}(r^{(2)})$, $T_{\Delta x_{1,3}}^{-1}(r^{(3)})$ (or $T_{\Delta x_{1,3}}(r^{(3)})$), and so on, combines $r^{(1)}$ and $T_{\Delta x_{1,2}}^{-1}(r^{(2)})$, $T_{\Delta x_{1,3}}^{-1}(r^{(3)})$ and soon through an LLR combiner 1220 using the result, and inputs an LLR vector r obtained from the result to the decoding apparatus of FIG. 6 to perform the decoding. The following process is the same as the decoding process as described above with reference to FIGS. 6 and 7. Here, it is to be noted that the LLR combiner 1220 can be changed to another type of combiner if the received signals (or received vectors) are not in the form configured by LLR. Further, the reverse quasi-cyclic converters 1210 and 620 may use different modules or the same modules.

In an embodiment of FIG. 12, a case where the reception device simultaneously combines all the signals (or received vectors) will be described, but successive combination may also be applied. For example, the reverie quasi-cyclic converter 1210 or the LLR combiner 1220 in FIG. 12 does not simultaneously perform the reverse quasi-cyclic shift or the signal combination with respect to the respective received signals, but it may determine whether to perform an additional combination depending on whether the decoding has succeeded after performing the decoding as the combination is successively performed. For more detailed explanation, a flowchart of FIG. 13 illustrating operations indicated in FIG. 13 will be described.

Figure 13:
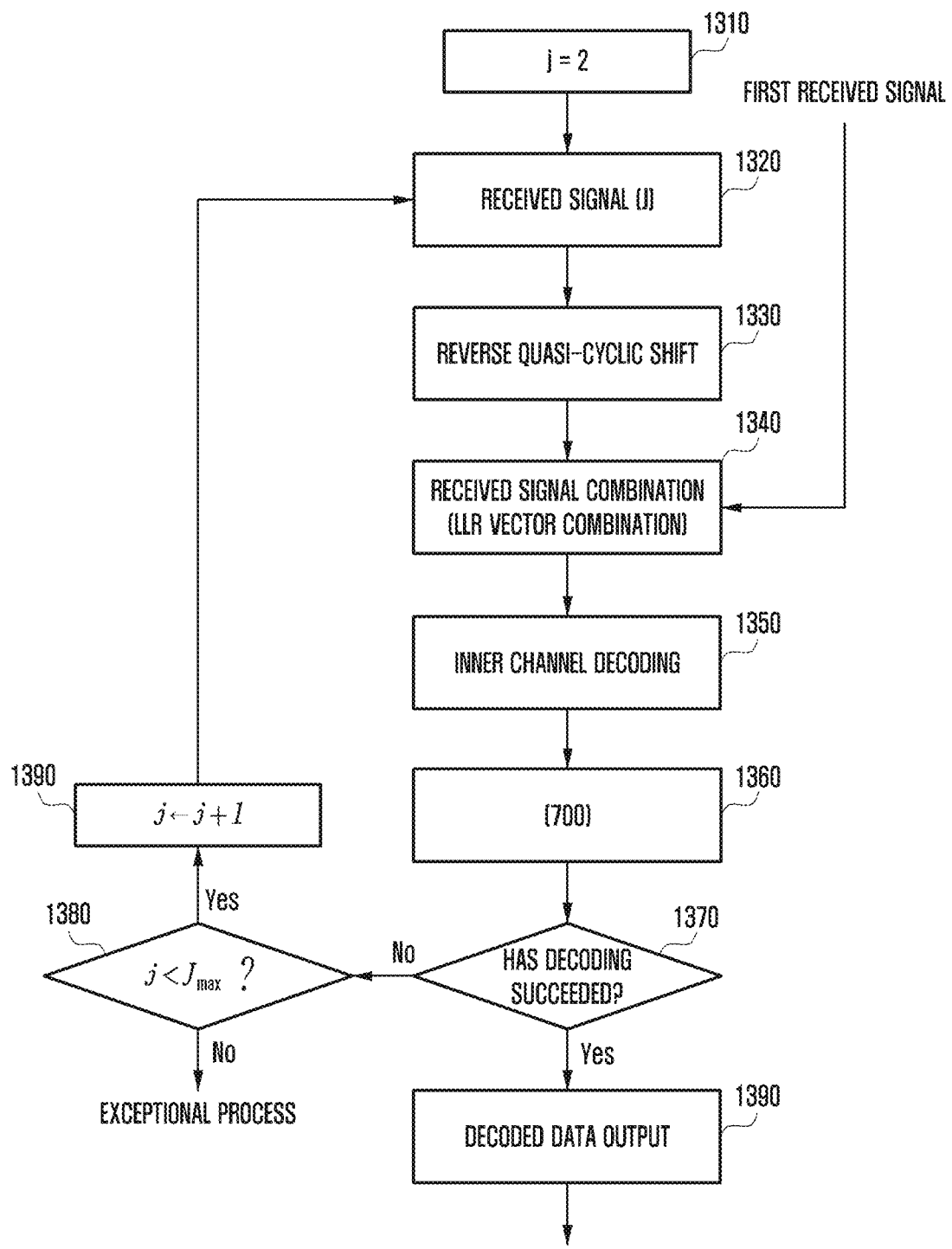
FIG. 13 is another exemplary flowchart of a decoding process based on combination of received signals according to an embodiment of the disclosure.

FIG. 13 is another exemplary flowchart of a decoding process based on combination of received signals according to an embodiment of the disclosure.

For this, it is assumed that a combination is performed based on a first received signal (or received vector). Further, it is assumed that there are $I_{max}$ received signals (or received vectors) that can be totally combined.

At operations 1310 and 1320, a reception device properly performs a reverse quasi-cyclic shift 1330 with respect to a second received signal (received signal j in the case of j=2 in FIG. 13) based on a difference between orders or locations of respective received signals. Here, it is to be noted that i is unrelated to the actual transmission order in a transmitter. Next, the reception device performs received signal combination (or LLR vector combination) 1340 with respect to a first received signal and the reverse-quasi-cyclic-shifted received signal. Further, the reception device performs inner channel decoding 1350 based on the combined received signals (or LLR vectors).

Next, at operation 1360, the reception device performs a decoding process 700 indicated in FIG. 7 with respect to the data decoded through the inner channel decoding and a first parity bit. In FIG. 7, operation 700 means operations 720 to 770. At operation 1370, it should be determined whether to perform additional received signal combination and decoding by determining whether the decoding has succeeded as the result of the decoding process 700. Determination of whether the decoding has succeeded at operation 1370 may be performed based on a case where error detection or exceptional processing is performed using operation 760 of FIG. 7. If it is intended to perform the additional decoding through determination of decoding failure, the reception device should grasp whether there are received signals to be combined. Accordingly, at operation 1380, the reception device determines whether the number of already combined received signals exceeds the total number $J_{max}$ of combinable received signals. In accordance with systems, the basis of the determination may be set to be smaller than $J_{max}$ in consideration of decoding complexity or latency. If there are additionally combinable received signals as the result of the determination, the reception device repeats the same processes from operation 1320 through operation 1390.

If it is determined that the decoding has succeeded at operation 1360 or 1370, the reception device performs operation 1390 to output the decoded data, and if it is determined that there are not the additionally combinable received signals any more at operation 1380, the reception device performs the exceptional process, such as decoding failure declaration.

The embodiments as described above with reference to FIGS. 12 and 13 are selectable in accordance with the decoding complexity and latency and limitations, such as a receiver memory, and it is possible to implement the received signal combination applying various combination bases.

Up to now, explanation has been made in the case of being limited to $T_{max} < L$ in the mathematical expression 9. It can be known that it is limited to a case where quasi-cyclic shift values are distinctively discriminated from each other with respect to the QC LDPC code given in the mathematical expression 3. Further, it is to be noted that it is advantageous not to perform blind decoding of the inner channel code in FIGS. 3 to 13.

Hereinafter, as another embodiment of the disclosure, the condition of $T_{max} \geq L$ will be described. If the above-described condition is satisfied, the condition of iv) in the mathematical expression 9 may not be satisfied. That is, even in the case of $X_1 \neq X_2$, $g(x_1) = g(x_2)$ may not be satisfied. Because the same quasi-cyclic shift value may exist with respect to two or more different x as described above, there is a possibility that x is unable to be specified through the disclosure as described above according to circumstances. In this case, a new method for efficiently combining the method proposed in the disclosure and the blind decoding method will be described.

Prior to this, converters $T_x(\cdot)$ and $S_y(\cdot)$ for converting a codeword c or information word s of a certain QC LDPC code are defined as in the following mathematical expression 15.

i) $P$ is a circulant permutation matrix having a size of $L \times L$ ii) $c$ is a certain vector having a size of $N = L \times n$, $P_N$ is a circulant permutation matrix having a size of $N \times N$ iii) $I = 0, 1, 2, \ldots, T_{max} - 1, (T_{max} \geq L)$ iv) The following bijective mapping $f$ exists with respect to $X = \{0, 1, 2, \ldots, L-1\}$ and $Y = \{0, 1, 2, \ldots, N-1\}$: $f : 1 \rightarrow (X, Y)$.

v) $t_x(c) \triangleq (P^{g(x)} c_0, P^{g(x)} c_1, P^{g(x)} c_2, \ldots, P^{g(x)} c_n)$, $T_x^{-1}(c) \triangleq (P^{-g(x)} c_0, P^{-g(x)} c_1, P^{-g(x)} c_2, \ldots, P^{-g(x)} c_n)$ $x \in X, 0 \leq g(x) < L$.

$S_y(c) \triangleq P_N^{h(y)} \cdot c, S_y^{-1}(c) \triangleq P_N^{-h(y)} \cdot c$ $y \in Y, 0 \le h(y) < N.$ vi) $\forall (x_1,y_1),(x_2,y_2) \in (X,Y),$ $(x_1,y_1) \ne (x_2,y_2) \Rightarrow (g(x_1),h(y_1)) \ne (g(x_2),h(y_2))$   Mathematical expression 15

With reference to a block diagram of FIG. 14, an embodiment of the disclosure using a converter $T_x(\cdot)$ and $S_y(\cdot)$ defined in the mathematical expression 15 will be described.

Figure 14:
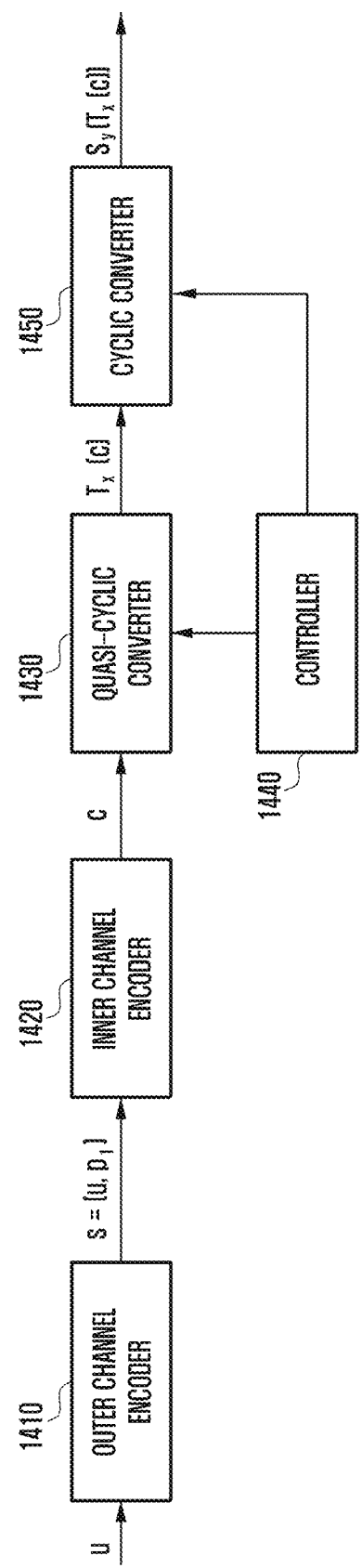
FIG. 14 is a block diagram of another transmission device according to an embodiment of the disclosure.

FIG. 14 is a block diagram of another transmission device according to an embodiment of the disclosure.

With reference to FIG. 14, it is first assumed that data u includes other information in addition to the message or data corresponding to the integer. A transmission device generates a first parity bit $p_1$ by performing outer encoding of the data u through an outer channel encoder 1410. As an outer channel code for the outer channel encoder 1410, a general channel code capable of performing error detection, such as a cyclic redundancy check (CRC) code, a Bose-Chaudhuri-Hocquenghem (BCH) code, or a proper parity check code, may be used.

If it is assumed that $(u,p_1)$ is s, s means input bits (or input bit vectors) of an inner channel encoder 1420. The transmission device generates a second parity bit $p_2$ by performing inner channel encoding of the input bits $(u,p_1)$ through the inner channel encoder 1420. In the disclosure, the inner channel code for the inner channel encoder 1420 is explained through applying of the QC LDPC code having the parity check matrix as in the mathematical expression 3, but in general, any channel code satisfying the quasi-cyclic characteristic of the mathematical expression 13 is applicable.

If the inner channel encoder 1420 corresponds to the systematic channel code, the data u, the first parity, and the second parity become the codeword c for the inner channel encoder 1420.

In order to transmit the integer or the corresponding message through a quasi-cyclic converter 1430, the transmission device properly applies the quasi-cyclic shift to the codeword c. A controller 1440 controls to determine a value g(x)(or x corresponding to this) for quasi-cyclic-shifting the codeword c in accordance with the integer or the corresponding message, and it controls to generate a quasi-cyclic-shifted codeword $T_x(c)$ by properly performing the quasi-cyclic shift through the quasi-cyclic converter 1430. The strictures of 1410 to 1440 in FIG. 14 may be the same as those in FIG. 3. However, in FIG. 14, the contoller 1440 controls to determine a cyclic value h(y)(or y corresponding to this) for cyclic-shifting the codeword $T_x(c)$ in accordance with the integer or the corresponding message or data, and it controls to generate a cyclic-shifted final codeword $S_y(T_x(c))$ to be transmitted by the transmitter by additionally performing the cyclic shift through the cyclic converter 1450 with respect to the quasi-cyclic shifted codeword $T_x(c)$.

Figure 15:
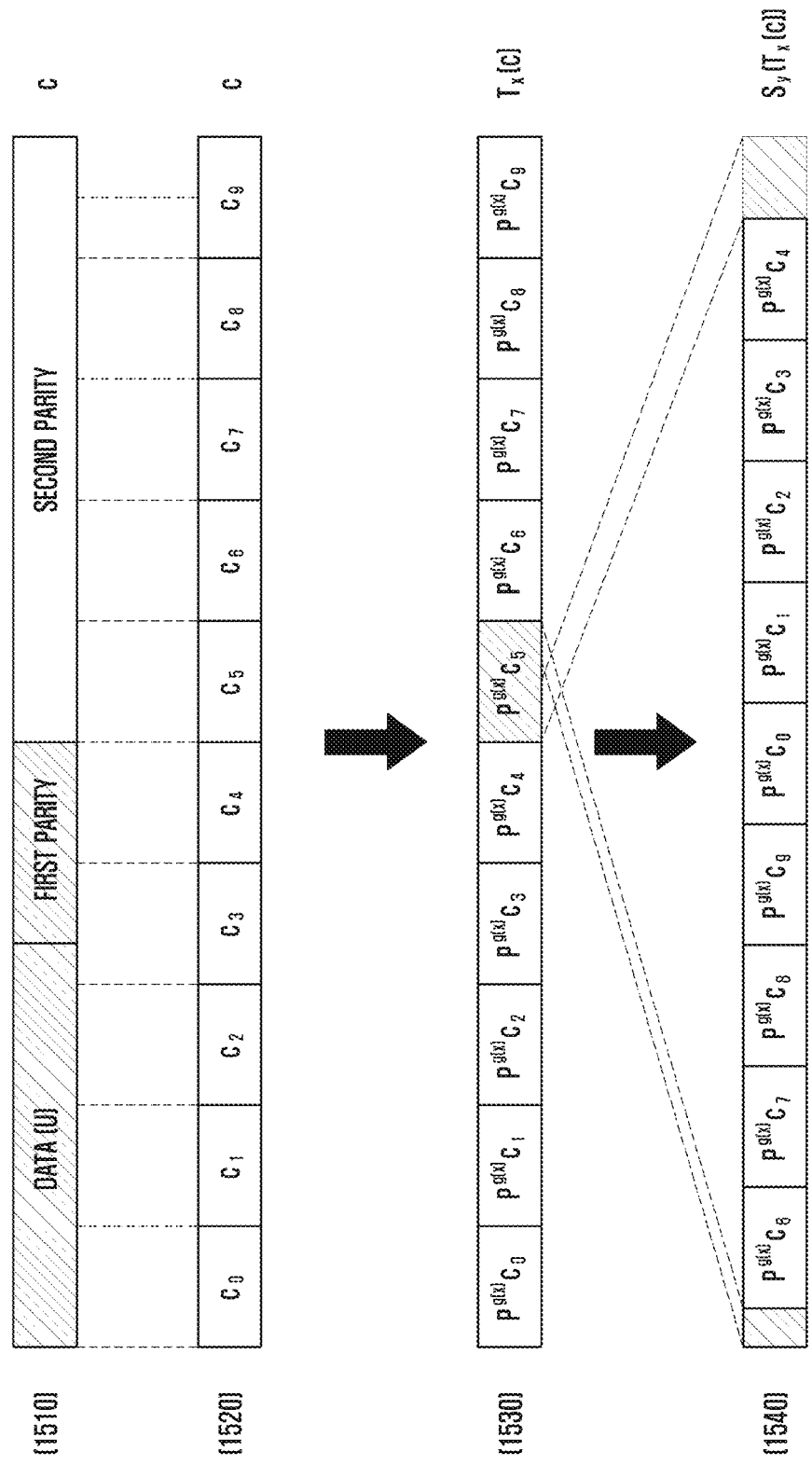
FIG. 15 is an exemplary diagram of a quasi-cyclic shift and acyclic shift of a codeword according to an embodiment of the disclosure.

The process in accordance with the operation of FIG. 14 is simply illustrated in FIG. 15.

FIG. 15 is an exemplary diagram of a quasi-cyclic shift and a cyclic shift of a codeword according to an embodiment of the disclosure.

With reference to FIG. 15, the transmission device divides a codeword bit 1510 obtained from the inner channel encoder of FIG. 14 in the unit of a length L as 1520, and it generates a quasi-cyclic-shifted codeword 1530 by performing quasi-cyclic conversion. Next, the transmitter, such as 1540, generates a codeword for being transmitted by the transmitter by applying a proper cyclic shift to the quasi-cyclic-shifted codeword 1530.

Figure 16:
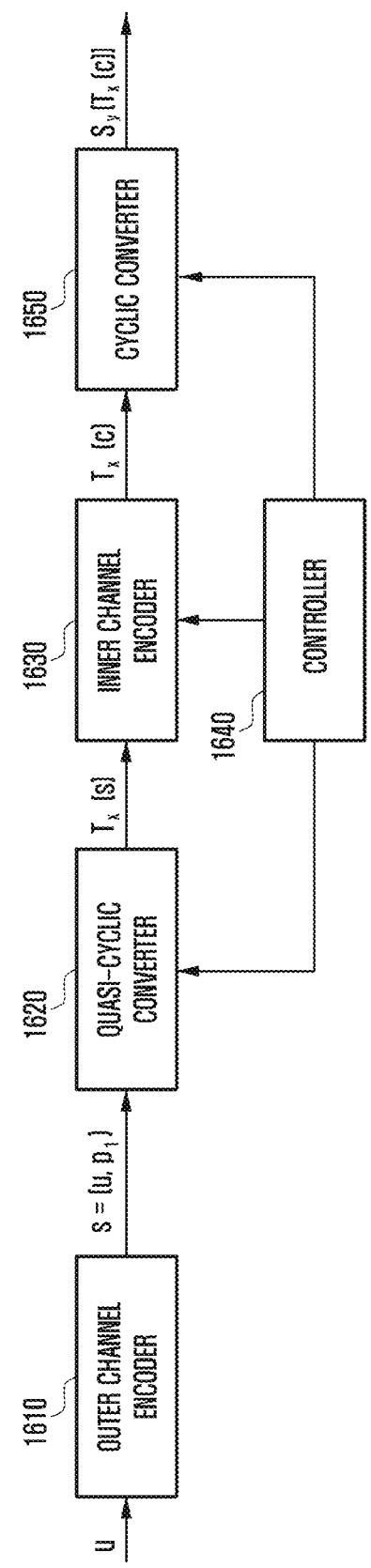
FIG. 16 is a block diagram of another transmission device according to an embodiment of the disclosure.

The operations indicated in FIGS. 14 and 15 can be realized also in a method as illustrated in FIG. 16.

FIG. 16 is a block diagram of another transmission device according to an embodiment of the disclosure. With reference to FIG. 16, a transmission device first generates a first parity bit $p_1$ by performing outer channel encoding of data u through an outer channel encoder 1610. Next, in order to transmit an integer or a corresponding message through a quasi-cyclic converter 1620, the transmission device properly applies quasi-cyclic conversion with respect to the data and the first parity bit $s=(u, p_1)$. In this case, a controller 1640 controls to determine a value g(x)(or x corresponding to this) for quasi-cyclic-shifting the data and the first parity bit $s=(u, p_1)$ in accordance with the integer, the corresponding message, or the data, and it controls to properly perform a quasi-cyclic-shift $T_1(s)$ through the quasi-cyclic converter 1620.

Next, the transmission device receives an input of the quasi-cyclic-shifted data and the first parity bit, and it performs inner channel encoding through an inner channel encoder 1630 to generate a codeword $T_x(c)$. Last, the transmission device generates a cyclic-shifted final codeword $S_y(T_x(c))$ to be transmitted by the transmitter by additionally performing the cyclic shift with respect to the generated codeword $T_x(c)$ through a cyclic converter 1650. Here, the controller 1640 controls to determine a value h(y)(or y corresponding to this) for cyclic-shifting the codeword $T_x(c)$ in accordance with the integer, the corresponding message, or the data, and it controls to generate a cyclic-shifted final codeword $S_y(T_x(c))$ to be transmitted by the transmitter by additionally performing the cyclic shift with respect to the quasi-cyclic-shifted codeword $T_x(c)$ through the cyclic converter 1650.

It is to be noted that the reason why the orders of the quasi-cyclic converter and the inner channel encoder are exchangeable in FIGS. 14 and 16 is that the inner channel code used in the inner channel encoder 1420 or 1630 satisfies the quasi-cyclic characteristic of the mathematical expression 13.

Next, a method and an apparatus for decoding the data u, the quasi-cyclic-shifted value g(x)(or x corresponding to this), and the cyclic-shifted value h(y)(or y corresponding to this) being transmitted using the method and the apparatus as illustrated in FIGS. 14 to 16 through a receiver will be described with reference to FIG. 17.

Figure 17:
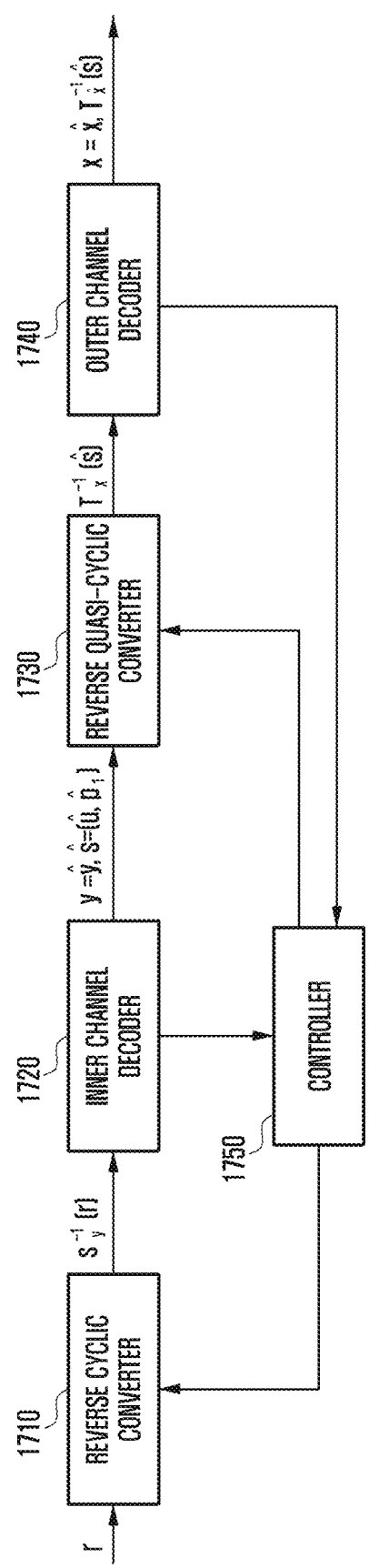
FIG. 17 is a block diagram of another reception device according to an embodiment of the disclosure.

FIG. 17 is a block diagram of another reception device according to an embodiment of the disclosure.

First if a received signal r is received, a receiver applies a cyclic shift using a cyclic converter 1710. In this case, if the receiver is not aware of information on the cyclic-shifted value h(y)(or y corresponding to this), it applies the cyclic shift through setting of a proper initial value. The reverse cyclic converter 1710 outputs a reverse-cyclic-shifted received signal $S_y^{-1}(r)$ for the initial value to be input to an inner channel decoder 1720. The inner channel decoder 1720 performs decoding, and if the decoding has succeeded, the inner channel decoder 1729 outputs a corresponding cyclic shift value y=ŷ decoded data, and a first parity. In this case, if the decoding has failed in the inner channel decoder 1720, the reverse cyclic converter 1710 changes the y value through the controller to apply the corresponding reverse cyclic shift value h(y) and decoding through the inner channel decoder 1720 is performed again after the reverse cyclic shift is applied to the received signal again. The decoding may be repeated until the decoding is successful, and whether the decoding for the inner channel code is successful may be determined in various methods. For example, whether the decoding is successful may be determined in consideration of a syndrome value for the inner channel code, or it may be determined in accordance with the change or the range of metric values used in the decoding process.

The reverse quasi-cyclic shift is performed with respect to the restored data and the first parity $\hat{s}=(\hat{u}, \hat{p}_1)$ as the output of the inner channel decoder 1720 through a reverse quasi-cyclic converter 1730. If the result of applying the reverse quasi-cyclic shift for x to $\hat{s}$ is $T_x^{-1}(\hat{s})$ the reception device performs decoding of the reverse-quasi-cyclic-shifted $T_x^{-1}(\hat{s})$ as its input through the outer channel decoder 1740. Here, x may be in the range of 0≤x<L as defined in the mathematical expression 9, and if the reverse quasi-cyclic shift value g(x)(or x) does not coincide with the value transmitted from the actual transmitter, there is a high possibility that the outer channel decoder 1740 detects an error. If the error is detected as described above, the reception device repeats the same process as changing the reverse quasi-cyclic shift value through the controller 1750. This process is repeated until the err is not detected by the outer channel decoder 1740, and in the case of x=$\hat{x}$, the outer channel decoder 1740 may output x=$\hat{x}$ and the corresponding result of the reverse-quasi-cyclic-shifted $T_x^{-1}(\hat{s})$ if no error is determined through the outer channel decoder 1740. As a result, the receiver can decode the quasi-cyclic-shifted value g(x)(or x corresponding to this), h(y)(or y corresponding to this), and the data u transmitted from the transmitter through the decoding process of FIG. 17.

The decoding process indicated in FIG. 17 will be described in detail through a flowchart of FIG. 18.

Figure 18:
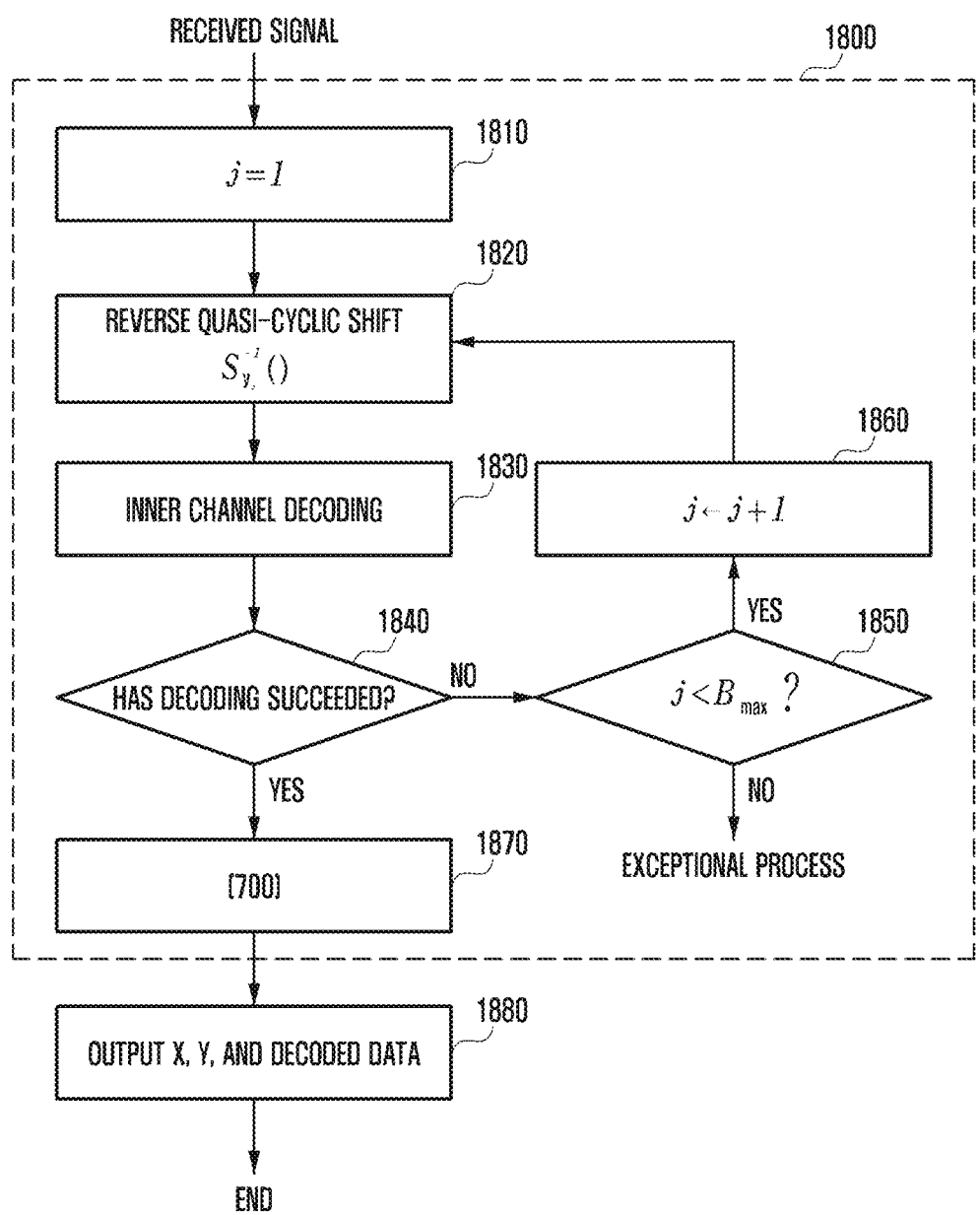
FIG. 18 is another exemplary flow chart of a decoding process according to an embodiment of the disclosure.

FIG. 18 is another exemplary flowchart of a decoding process according to an embodiment of the disclosure.

First, a receiver performs reverse cyclic shift 1820 with respect to a received signal (or received vector or received LLR vector). In FIG. 18, an initial value for performing a reverse cyclic shift 1820 is set to j=1, but it can be changed in accordance with the requirements of the system.

The reception device performs inner channel decoding 1830 based on the reverse-cyclic-shifted received signal. After completing the inner channel decoding 1830, the operation of the reception device may differ depending on whether the decoding has succeeded. For example, if the decoding continuously fails, the reception device contiguously repeats operations 1820 to 1840 through operation 1860 until the j value reaches $B_{max}$. Here, $B_{max}$ means the total number of y values for applying the reverse cyclic shift. If an error is continuously detected even if the j value reaches $B_{max}$, it is determined that the decoding has failed at operation 1850, and an exceptional process, such as decoding failure declaration, is performed.

If the decoding has succeeded with respect to a specific j value at operation 1830, the reception device performs operation 1870 at operation 1840. In this case, the reception device may output y=$\hat{y}$=yj value with respect to the successful j value.

The reception device performs the decoding process 700 indicated in FIG. 7 with respect to the data decoded through the success of the inner channel decoding 1830 and a first parity bit. In FIG. 7, operation 700 means operations 720 to 770. As the result of the decoding process 700, the reception device, at operation 1880, outputs the decoded data and x, y values. If the decoding has failed in the decoding process 700, the reception device performs an exceptional process, such as the decoding failure declaration.

The biggest feature of the disclosure proposed in FIGS. 3 to 13 is that blind decoding is not performed with respect to the inner channel code, and thus decoding complexity and latency become very low. Further, in the case where a plurality of codewords are transmitted and the receiver is aware of the difference between the transmission orders or locations of the respectively codewords, the receiver can provide an efficient received signal combination and decoding method. However, the method can be used only in the case where information on the codeword transmission orders or locations is equal to or smaller than L corresponding to the size of the circulant permutation matrix or the circulant matrix.

The biggest feature of an embodiment of the disclosure proposed in FIGS. 14 to 18 is that the method can be applied if the transmission is necessary in the case where information on the codeword transmission orders or locations is equal to or smaller than L corresponding to the size of the circulant permutation matrix or the circulant matrix. The data of the orders or the locations larger than L or other data can be transmitted by properly applying the quasi-cyclic shift and the cyclic shift, and thus a larger amount of data can be transmitted. However, with reference to FIGS. 17 and 18, the blind decoding for the inner channel code is certainly necessary. This may cause complexity increase and latency.

In an embodiment of FIGS. 14 to 18, for convenience in explanation, only the conversion based on the cyclic shift $S_y(\cdot)$ defined in the mathematical expression 15 has been described as the conversion of all codewords. However, in general, not only the cyclic shift but also any conversion $S_y(\cdot)$ satisfying the following mathematical expression 16 can be applied.

$$\forall (x_1,y_1),(x_2,y_2)\in (X,Y),$$

$$(x_1,y_1)\neq(x_2,y_2)\Rightarrow S_{y_1}(T_{x_1}(c))\neq S_{y_2}T_{x_2}(c)) \quad \text{Mathematical expression 16}$$

For example, block-wise or random permutation may be applied, and a method for converting the codeword using a scrambling sequence may also be applicable. Further, it is also possible to convert the codeword through a method in which the codeword that is stored in a memory such as a circular buffer is output in accordance with a predetermined rule.

According to the method proposed in FIGS. 14 to 18, the complexity may be greatly increased when the decoding is performed through combination of respective received signals generally in the case where the decoding of the received signals has failed due to an inferior transmission/reception environment. Accordingly, in order to reduce the complexity increase in consideration of the combination of the received signals, time indexes, SS block indexes, SS block time indexes, system fume numbers, or predetermined different pieces of data, which are intended to be transmitted, and a mapping relationship between the quasi-cyclic shift $T_x(\cdot)$ and the cyclic shift $S_y(\cdot)$ may exert an important influence on the complexity increase.

Hereinafter, as another embodiment of the disclosure, a method is proposed, which transmits and receives a larger amount of information as compared with the method proposed in FIGS. 3 to 13 while greatly limiting the decoding complexity increase through improvement of the method of FIGS. 14 to 18.

First, another embodiment of the disclosure in which conditions iv) and v) of the mathematical expression 15 are changed to those of the following mathematical expression 17 will be described.

Mathematical expression 17 iv) The following bijective mapping $f:I \to$ $(X, Y)$ exists with respect to $X =$ $\{0, 1, 2, \ldots, L-1\}$ and $Y = \{0, 1, 2, \ldots, N-1\}$ $f(k) = (Q(k, D), a \times R(k, D))$ $\left(a \text{ is a positive integer satisfying } 0 < a \leq \dfrac{N}{D}\right)$.

Here, $Q(k, D)$ means a quotient of $k$ and $D$, and $R(k, D)$ means a remainder of $k$ and $D$.

That is $k = D \times Q(k, D) + R(k, D)$, $(0 \leq R(k, D) < D)$.

v)

$T_k(c) \triangleq \left(P^{Q(k,D)}c_0, P^{Q(k,D)}c_1, P^{Q(k,D)}c_2, \ldots, P^{Q(k,D)}c_n\right)$ $T_k^{-1}(c) \triangleq \left(P^{-Q(k,D)}c_0, P^{-Q(k,D)}c_1, P^{-Q(k,D)}c_2, \ldots, P^{-Q(k,D)}c_n\right)$ $S_k(c) \triangleq P_N^{a \times R(k,D)} \cdot c$ $S_k^{-1}(c) \triangleq P_N^{-a \times R(k,D)} \cdot c$ In order to analyze method according to the disclosure set in the mathematical expressions 15 and 17, the method will be described through the following detailed embodiment First, detailed mapping rules and parameters for the mathematical expressions 15 and 17 are indicated in the following mathematical expression 18.

Mathematical Expression 18 i) $L=16$, $D=4$, $n=24$, $N=L*n=16*24$, $a=96$ ii) $I=0, 1, 2, \ldots, 63$ (i.e. Tmax=64)

iii)

| k | f (k) | |
|---|---|---|
|   | Q(k,4) | R(k,4) |
| 0 | 0 | 0 |
| 1 | 0 | 1 |
| 2 | 0 | 2 |
| 3 | 0 | 3 |
| 4 | 1 | 0 |
| 5 | 1 | 1 |
| 6 | 1 | 2 |
| ... | ... | ... |
| 60 | 15 | 0 |
| 61 | 15 | 1 |
| 62 | 15 | 2 |
| 63 | 15 | 3 |

Basically, as an embodiment of the disclosure, the data transmission method and apparatus proposed in FIGS. 14 to 18 can be applied as they are even if they have parameters in the mathematical expression 18. That is, the respective codewords having the parameters can be encoded and decoded in accordance with the method proposed in FIGS. 14 to 18.

However, a method is proposed, which can perform efficient decoding though combination of received signals corresponding to the corresponding codewords if the decoding of all the respective codewords has failed. The purpose of the method and the apparatus proposed in the disclosure is to greatly reduce the decoding complexity in performing the blind decoding of the inner channel code based on the received signals combined with the method for combining the received signals.

In order to consider the characteristics in the case of having the mapping rules and parameters as in the mathematical expression 18, a communication or broadcast system satisfying the conditions 1) to 5) may be considered again. That is, it is assumed that decoding of the respective codewords has failed in the receiver and the codeword transmission order or location information $k_i$, or $k_j$ ($k_i < k_j$) values are unable to be known, but their difference $\Delta k_{i,j} = k_j - k_i$ can be known. If it is possible to know $\Delta k_{i,j}$, respective values of $k_i$ or $k_j$ are not accurately known, but partial relationships between Q $(ki,D)$ and QR $(kj,D)$ or between R $(ki,D)$ and R $(kj,D)$ can be known using the establishment of the following mathematical expression 19.

Mathematical expression 19 if it is defined that $\Delta Q_{i,j}(D) \triangleq Q(k_j, D) - Q(k_i, D)$, $\Delta R_{i,j}(D) \triangleq R(k_j, D) - R(k_i, D)$, 1) $\left\lfloor \dfrac{\Delta k_{i,j}}{N/D} \right\rfloor \leq \Delta Q_{i,j}(D) \leq \left\lceil \dfrac{\Delta k_{i,j}}{N/D} \right\rceil$ 2) $R(\Delta R_{i,j}(D), D) = R(\Delta k_{i,j}, D)$ For example, if $\Delta k_{i,j}=7$, the $\Delta Q_{i,j}(4)$ value may be 0 or 1, and because of $R(\Delta k_{i,j},4)=3$, pairs of values that $R(k_i,4)$ and $R(k_j,4)$ can have may be only (0, 3), (1,0), (2, 1), and (3,2) having an accurate difference as much as 3. As a result, in the case of having the mapping rules and parameters as in the mathematical expression 17, it can be known that it is possible to apply the reverse cyclic shift to the received signal (or received LLR vector) corresponding to $k_y$ as much as −3, to apply the reverse quasi-cyclic shift to the received signal as much as 0 or −1, and to combine the reverse-cyclic and reverse-quasi-cyclic-shifted received signal with the received signal for $k_i$. In this embodiment, a combining method based on the received signal for $k_i$ has been described, but according to circumstances, it is apparent that the combination based on $k_j$ becomes possible.

Although the above-described received signal is combined, the accurate value of $R(k_i,4)$ is not known, and thus the decoding of the inner channel code may fail. Accordingly, it is only possible to determine the $R(k_i,4)$ value as successively applying the reverse cyclic conversion to the combined received signal. Accordingly, in the embodiment of the mathematical expression 17, information on the cyclic shift value is decoded by determining a case where the decoding succeeds with the $R(ki,4)$ value as applying the reverse cyclic conversion with respect to the values of 0, 1, 2, and 3. After the success of the inner channel decoding, $Q(ki,4)$ is determined by performing outer channel decoding through the reverse quasi-cyclic shift process at operation 700 of FIG. 7. If the decoding is successful with respect to $Q(ki,4)$ and $R(ki,4)$ through the above-described process, ki can be determined from the mathematical expression 16, and in this case, kj can also be determined.

In summary, the reception device calculates the reverse cyclic shift value and the reverse quasi-cyclic shift value in accordance with a predetermined rule from the difference between the orders or locations of the received signals corresponding to a plurality of pieces of transmitted data, and then the reception device applies the reverse cyclic and reverse quasi-cyclic shift with respect to the first received signal in accordance with the shift value. The reception device combines the first received signal and the second received signal to which the reverse cyclic and reverse quasi-cyclic shift are applied. The reception device performs the decoding of the inner channel code by applying the reverse cyclic shift as changing the reverse cyclic shift value based on the combined received signal. In this case, the reception device determines the cyclic shift value applied to the second received signal from the reverse cyclic shift value in the case of the decoding success. Further, based on the data and the parity for the case where the decoding has succeeded, the reception device performs the decoding for the outer channel code by applying the reverse cyclic shift as changing the reverse quasi-cyclic shift value. The reception device may determine the reverse quasi-cyclic shift value by determining whether an error is detected in accordance with the result of the outer channel decoding, and it may determine the quasi-cyclic shift value applied to the second received signal. Finally, the reception device may determine the order and the location of the data of the first received signal and the second received signal and the received signals corresponding to the data from the decoded cyclic shift and quasi-cyclic shift values.

In the mathematical expression 16, for convenience in explanation, only an embodiment of the cyclic shift is indicated, but it is apparent that it can be changed in various methods.

For example, block-wise or random permutation may be applied, and a method for converting the codeword using a scrambling sequence may also be applicable. Further, it is also possible to convert the codeword through a method in which the codeword that is stored in a memory such as a circular buffer is output in accordance with a predetermined rule.

Further, in the mathematical expression 16, explanation has been made only with respect to a uniform cyclic shift in the unit of a like $P_N^{a \times R(k,D)}$, but in general, it is apparent that various irregular cyclic shifts can be applied. Further, in the disclosure, for convenience in explanation, the quasi-cyclic shift is expressed by $P^{Q(k,D)}$, and the cyclic shift is expressed using the mathematical expression, such as $P_N^{a \times R(k,D)}$, but in the actual transmitter and receiver devices, it is to be noted that the quasi-cyclic/cyclic shift can be easily implemented through a circular bit shift or bit rotation or interleaver, or write/read method in a memory or buffer.

Although preferred embodiments of the disclosure have been described, various changes and modifications may be presented to an operator. It is intended that such changes and modifications are included in the appended claims.

What is claimed is:

1. A method of channel decoding performed by a receiver in a communication system, the method comprising:
receiving a first signal and a second signal corresponding to input bits;
identifying first values based on the first received signal and second values based on the second received signal;
identifying groups of the first values and groups of the second values, each of the groups of the first values and the groups of the second values having a bit group size;
performing quasi-cyclic shifting of the groups of the second values based on the bit group size and an integer,
combining the groups of the first values and the quasi-cyclic shifted groups of the second values;
performing inner decoding, based on an inner channel code, on the combined values;
performing outer decoding, based on an outer channel code, on an output of the inner decoding; and
identifying the input bits that indicate first data from an output of the outer decoding,
wherein the integer is identified as a difference between a first cyclic shift value applied to the groups of the first values and a second cyclic shift value applied to the groups of the second values, and
wherein second data is identified based on the first cyclic shift value, in case that the outer decoding is successful.

2. The method of claim 1, wherein:
the outer channel code includes at least one of cyclic redundancy check (CRC) code or Bose-Chaudhuri-Hocquenghem (BCH) code, and
the inner channel code includes a quasi-cyclic low density parity check (QC-LDPC) code.

3. The method of claim 1, wherein the first cyclic shift value is less than or equal to the bit group size, and
wherein the second cyclic shift value is less than or equal to the bit group size.

4. The method of claim 1, wherein combining the groups of the first values and the quasi-cyclic shifted groups of the second values further comprises adding the groups of the first values and the quasi-cyclic shifted groups of the second values in case that the first values and the second values are log-likelihood ratio (LLR) values.

5. The method of claim 1, wherein the first signal and the second signal are received through different beams.

6. The method of claim 1, further comprising:
after performing the outer decoding, in case that a decoding error is detected based on the outer decoding, performing quasi-cyclic shifting, based on a third cyclic shift value, on the output of the inner decoding to generate a quasi-cyclic shifted output; and
performing the outer decoding on the quasi-cyclic shifted output.

7. A method of channel encoding performed by a transmitter in a communication system, the method comprising:
performing outer coding, based on an outer channel code, of input bits that indicate first data;
identifying a bit group size;
identifying a plurality of bit groups based on an output of the outer coding the plurality of bit groups each having the bit group size;
determining a first cyclic shift value corresponding to second data and a second cyclic shift value;
performing quasi-cyclic shifting, based on the first cyclic shift value, of the plurality of bit groups to generate a first quasi-cyclic shifted output;
performing quasi-cyclic shifting, based on the second cyclic shift value, of the plurality of bit groups to generate a second quasi-cyclic shifted output;
performing inner coding, based on an inner channel code, of the first quasi-cyclic shifted output and the second quasi-cyclic shifted output; and
transmitting at least a part of an output of the inner coding.

8. The method of claim 7, wherein:
the outer channel code includes at least one of cyclic redundancy check (CRC) code or Bose-Chaudhuri-Hocquenghem (BCH) code, and
the inner channel code includes a quasi-cyclic low density parity check (QC-LDPC) code.

9. The method of claim 7, wherein the first cyclic shift value is less than or equal to the bit group size, and
wherein the second cyclic shift value is less than or equal to the bit group size.

10. The method of claim 7, wherein the output of the inner coding includes a first output of the inner coding of the first quasi-cyclic shifted output and a second output of the inner coding of the second quasi-cyclic shifted output, and wherein the first output and the second output are transmitted through different beams.

11. A receiver in a communication system, the receiver comprising:

a transceiver; and a controller coupled with the transceiver and configured to:

receive a first signal and a second signal corresponding to input bits, identify first values based on the first received signal and second values based on the second received signal, identify groups of the first values and groups of the second values, each of the groups of the first values and the groups of the second values having a bit group size, perform quasi-cyclic shifting of the groups of the second values based on the bit group size and an integer, combine the groups of the first values and the quasi-cyclic shifted groups of the second values, perform inner decoding, based on an inner channel code, on the combined values, perform outer decoding, based on an outer channel code, on an output of the inner decoding, and identify the input bits that indicate first data from an output of the outer decoding, wherein the integer is identified as a difference between a first cyclic shift value applied to the groups of the first values and a second cyclic shift value applied to the groups of the second values, and wherein second data is identified based on the first cyclic shift value, in case that the outer decoding is successful.

12. The receiver of claim 11, wherein:

the outer channel code includes at least one of cyclic redundancy check (CRC) code or Bose-Chaudhuri-Hocquenghem (BCH) code, and the inner channel code includes a quasi-cyclic low density parity check (QC-LDPC) code.

13. The receiver of claim 11, wherein the first cyclic shift value is less than or equal to the bit group size, and wherein the second cyclic shift value is less than or equal to the bit group size.

14. The receiver of claim 11, wherein the controller is configured to add the groups of the first values and the quasi-cyclic shifted groups of the second values for combining the groups of the first values and the quasi-cyclic shifted groups of the second values, in case that the first values and the second values are log-likelihood ratio (LLR) values.

15. The receiver of claim 11, wherein the first signal and the second signal are received through different beams.

16. The receiver of claim 11, wherein the controller is configured to:

perform quasi-cyclic shifting, based on a third cyclic shift value, on the output of the inner decoding to generate a quasi-cyclic shifted output, in case that a decoding error is detected based on the outer decoding after performing the outer decoding, and perform the outer decoding on the quasi-cyclic shifted output.

17. A transmitter in a communication system, the transmitter comprising:

a transceiver, and a controller coupled with the transceiver and configured to:

perform outer coding, based on an outer channel code, of input bits that indicate first data, identify a bit group size, identify a plurality of bit groups based on an output of the outer coding, the plurality of bit groups each having the bit group size;

determine a first cyclic shift value corresponding to second data and a second cyclic shift value;

perform quasi-cyclic shifting, based on the first cyclic shift value, of the plurality of bit groups to generate a first quasi-cyclic shifted output;

perform quasi-cyclic shifting, based on the second cyclic shift value, of the plurality of bit groups to generate a second quasi-cyclic shifted output;

perform inner coding, based on an inner channel code, of the first quasi-cyclic shifted output and the second quasi-cyclic shifted output; and transmit at least a part of an output of the inner coding.

18. The transmitter of claim 17, wherein:

the outer channel code includes at least one of cyclic redundancy check (CRC) code or Bose-Chaudhuri-Hocquenghem (BCH) code, and the inner channel code includes a quasi-cyclic low density parity check (QC-LDPC) code.

19. The transmitter of claim 17, wherein the first cyclic shift value is less than or equal to the bit group size, and wherein the second cyclic shift value is less than or equal to the bit group size.

20. The transmitter of claim 17, wherein the output of the inner coding includes a first output of the inner coding of the first quasi-cyclic shifted output and a second output of the inner coding of the second quasi-cyclic shifted output, and wherein the first output and the second output are transmitted through different beams.

* * * * *